(12) United States Patent
Ishimi

(10) Patent No.: US 6,225,840 B1
(45) Date of Patent: May 1, 2001

(54) CLOCK GENERATION CIRCUIT WHICH REDUCES A TRANSITION TIME PERIOD AND SEMICONDUCTOR DEVICE USING THE SAME

(75) Inventor: Kouichi Ishimi, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/387,896

(22) Filed: Sep. 1, 1999

(30) Foreign Application Priority Data

Feb. 18, 1999 (JP) .................................... 11-040499

(51) Int. Cl.$^7$ .................................... H03B 19/00

(52) U.S. Cl. ..................... 327/116; 327/159; 327/160

(58) Field of Search ........................... 327/156, 158–161, 327/116, 119; 377/47

(56) References Cited

U.S. PATENT DOCUMENTS

| | | | |
|---|---|---|---|
| 5,687,202 | 11/1997 | Eitrheim | 327/156 |
| 5,771,264 | * 7/2000 | Lane | 327/158 |
| 6,087,868 | * 7/2000 | Millar | 327/156 |

OTHER PUBLICATIONS

Kouichi Ishimi et al., "A Full–Digital PLL for Low Voltage LSIs," The Institute of Electronics, Information and Communication Engineers, Technical Report of IEICE, ED97–45, SDM97–23, ICD97–35, Jun. 1997, pp. 29–36 and English language abstract.

Michel Combes et al., "A Portable Clock Multiplier Generator Using Digital CMOS Standard Cells," IEEE Journal of Solid–State Circuits, vol. 31, No. 7, Jul. 1996, pp. 958–965.

* cited by examiner

Primary Examiner—Kenneth B. Wells
(74) Attorney, Agent, or Firm—Burns, Doane, Swecker & Mathis, LLP

(57) ABSTRACT

When a reset signal (PLL-RST) is input, an arithmetic unit (12) measures the cycle of an input clock (IN) with a pulse counter (9) and based on the measured cycle, calculates a count value such that a delay clock (DL-OUT) and an input clock (IN) may come into synchronization with each other, to set it to a counter (13). The counter (13) thereafter changes the count value step by step in accordance with an output signal from a phase comparator (18). After the count value of the counter (13) is set by the arithmetic unit (12), an arithmetic unit (30) calculates a count value such that an output clock (PLL-OUT) and the input clock (IN) may come into synchronization with each other, to set it to a counter (31). The counter (31) changes the count value step by step in accordance with an output signal from a phase comparator (35) only when the two phases compared by the phase comparator (18) coincide with each other. With this configuration, a transition period to achieve a stable output clock can be reduced.

15 Claims, 13 Drawing Sheets

F I G. 2
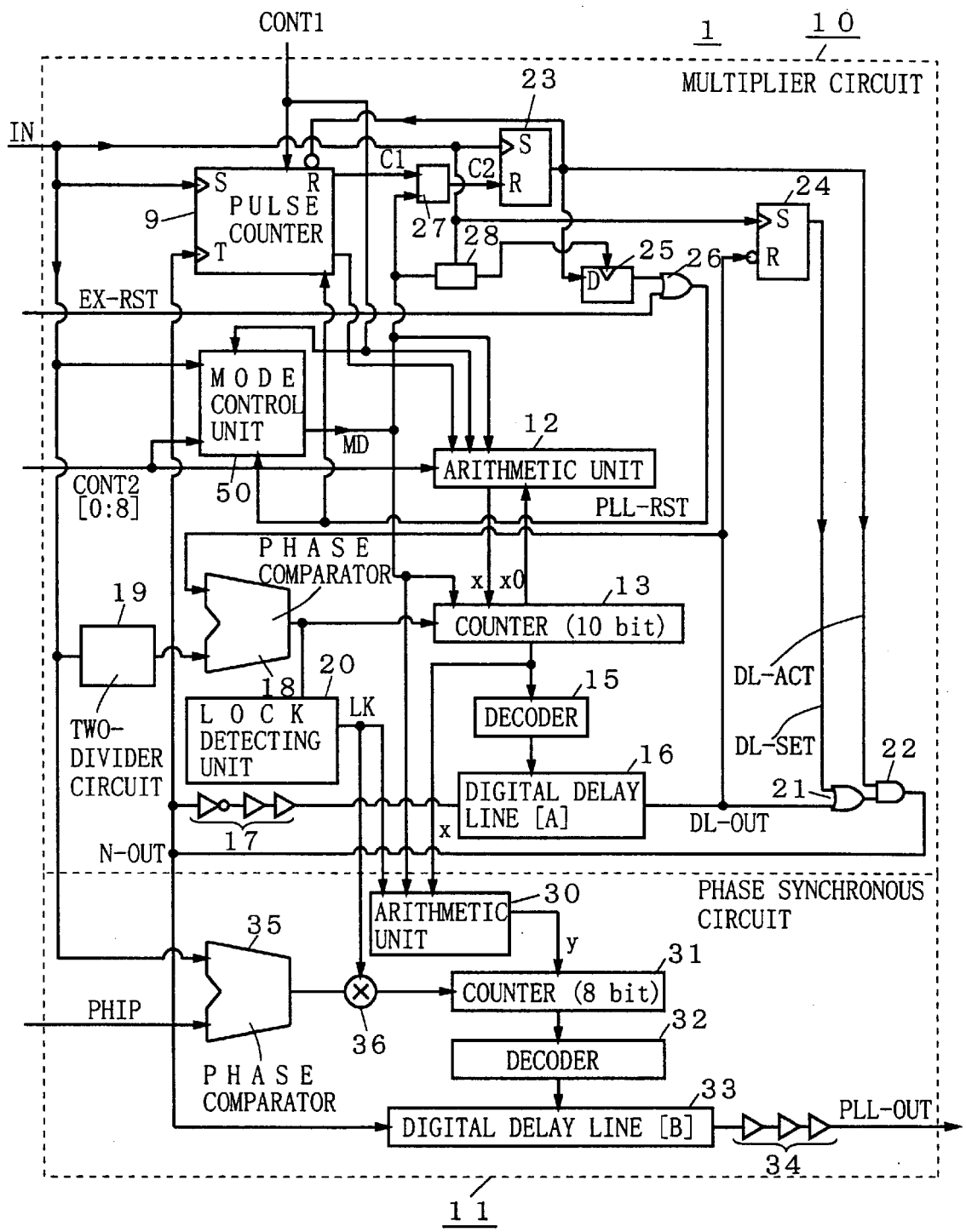

| OPERATION MODE | MD 1 | MD 2 |
|---|---|---|
| INPUT CLOCK CYCLE MEASUREMENT MODE | 0 | 0 |
| COUNTER OPERATION/SETTING MODE | 1 | 0 |
| FINE-TUNING MODE | 1 | 1 |

| CONT2 [1:8] | i |
|---|---|
| 00000001 | 1/16 |
| 00000010 | 1/4 |
| 00000100 | 1/3 |
| 00001000 | 1/2 |
| 00010000 | 1.5 |
| 00100000 | 2 |
| 01000000 | 3 |
| 10000000 | 4 |

CLOCK GENERATION CIRCUIT WHICH REDUCES A TRANSITION TIME PERIOD AND SEMICONDUCTOR DEVICE USING THE SAME

BACKGROUND OF THE INVENTION

1. Field of the Invention

The present invention relates to a clock generation circuit, suitable to be integrated in a microprocessor, for multiplying a frequency of an input clock to output it and a semiconductor device comprising the clock generation circuit, and more particularly to an improvement technique to reduce a time period until a stable output clock is obtained.

2. Description of the Background Art

A clock generation circuit having a PLL (Phase Locked Loop) circuit outputs a clock in synchronization with an input clock (synchronous clock) or a clock obtained by multiplying the input clock (multiplied clock). A recent microprocessor, which operates in synchronization with a high-speed clock of several tens to several hundreds MHz, necessarily incorporates the clock generation circuit for outputting the multiplied clock.

A background-art PLL circuit is an analog-type one, which comprises a voltage control oscillator (VCO) and controls a capacitor voltage for holding a control voltage of the VCO with a charge pump to control an oscillation frequency. The analog PLL circuit, however, has problems of being hard to control under a low power supply voltage, low noise immunity, requiring a long time period to achieve a stable operation (i.e., a long lock period), and taking a time to resume an operation when the oscillation of the PLL circuit is stopped by stop of the input clock. To solve these problems, some PLL circuits with digital delay line have been revealed.

FIG. 20 is a block diagram showing a configuration of a background-art clock generation circuit 151. The clock generation circuit 151 is revealed in "Development of Full Digital PLL for Lower Voltage" by Kouichi Ishimi and two others: "Shingakugihou", Vol. 97, No. 106, pp. 29 to 36, June, 1997, which comprises a PLL circuit 70 and a buffer 73. The PLL circuit 70 is a digital-type one, comprising a multiplier circuit 71 and a phase synchronous circuit 72. The multiplier circuit 71 multiplies a frequency of an input clock IN to output a multiplied clock N-OUT. The phase synchronous circuit 72 delays the multiplied clock N-OUT by a certain amount of delay (delay time) to output it as an output clock PLL-OUT.

The output clock PLL-OUT is output as an output clock PHI through the buffer 73. The output clock PHI is supplied for other circuits which operate in synchronization therewith. The output clock PHI is further fed back to the phase synchronous circuit 72. The phase synchronous circuit 72 compares the input clock IN with the fed-back output clock PHI in phase and determines the amount of delay of the output clock PLL-OUT with respect to the multiplied clock N-OUT so that the phase difference may be cancelled. That produces a clock in synchronization with the input clock IN, with its frequency multiplied, as the output clock PHI.

FIG. 21 is a block diagram showing an internal configuration of the multiplier circuit 71. The multiplier circuit 71 comprises a digital delay line 75, a delay fine-tuning circuit 76, an OR circuit 80 and a ring oscillator including an AND circuit 81. The digital delay line 75 is configured as a variable delay circuit, comprising a plurality of delay elements which can be selectively cascaded. The amount of delay can be changed step by step, in proportion to the number of cascaded delay elements. The delay fine-tuning circuit 76 is configured as the same variable delay circuit. The amount of change in the amount of delay for one step is determined smaller in the delay fine-tuning circuit 76 than in the digital delay line 75.

Thus, the amount of delay is variable in the ring oscillator. Further, the ring oscillator is configured as such a negative feed-back loop as to invert the level of a signal in a single cycle along the loop. The ring oscillator therefore oscillates, and half of the oscillation cycle, i.e., half cycle, corresponds to the amount of delay in the single cycle.

A phase comparator 79 compares a delay clock DL-OUT obtained from an output of the delay fine-tuning circuit 76 included in the ring oscillator (precisely, a clock obtained by dividing the delay clock DL-OUT by its multiplication ratio) with the input clock IN in phase, and increments a count value of a digital counter 78 when the former phase gets behind and conversely decrements the count value when gets ahead. When the phases coincide with each other, the count value is kept constant.

The digital counter 78 inputs its count value into the digital delay line 75 and the delay fine-tuning circuit 76. The total amount of delay of the digital delay line 75 and the delay fine-tuning circuit 76 thereby changes proportionally to the count value. Thus, the amount of delay of the ring oscillator is controlled so that the phase of the delay clock DL-OUT may coincide with that of the input clock IN.

Based on the input clock IN and the delay clock DL-OUT, a control unit 82 transfers a signal DL-SET to the OR circuit 80 and a signal DL-ACT to the AND circuit 81. That produces the multiplied clock N-OUT as a clock signal having a predetermined multiplication ratio with respect to the input clock IN.

FIG. 22 is a timing chart showing an operation of the multiplier circuit 71. At a rise of the input clock IN corresponding to the start of one clock cycle of the input clock IN, the control unit 82 asserts (activates) the signal DL-ACT. The multiplied clock N-OUT thereby changes from a low level to a high level. As a result, the delay clock DL-OUT changes from a low level to a high level at the time when the delay clock DL-OUT is delayed by the amount d of delay corresponding to the amount of delay of the ring oscillator (more exactly, the total amount of delay of the digital delay line 75 and the delay fine-tuning circuit 76).

The control unit 82 asserts the signal DL-SET only in the time period from the rise of the input clock IN to the first rise of the delay clock DL-OUT after that, and negates (normalizes) it in other period. At the time when the multiplied clock N-OUT completely outputs pulses of which number corresponds to a predetermined multiplication ratio from the rise of the input clock IN, the control unit 82 negates the signal DL-ACT. FIG. 22 shows a case where the multiplication ratio is four.

As a result, at every rise of the input clock IN, four pulses are output as the multiplied clock N-OUT. As shown in FIG. 22, when the fourth phase of the delay clock DL-OUT comes earlier because the amount d of delay is smaller than an appropriate amount, the count value of the digital counter 78 is incremented by one every one clock cycle of the input clock IN so as to delay the phase. As a result, pulse widths of the delay clock DL-OUT and the multiplied clock N-OUT increase and then the delay clock DL-OUT and the input clock IN coincide with each other in phase (in other words, the multiplier circuit 71 comes into a lock state).

When the amount d of delay is larger than the appropriate amount, conversely, the count value is decremented by one so as to make the phase earlier. That achieves the lock state. In the lock state obtained is a clock with its frequency multiplied by a predetermined multiplication ratio of the frequency of the input clock IN, as the multiplied clock N-OUT.

FIG. 23 is a block diagram showing an internal configuration of the phase synchronous circuit 72. In the phase synchronous circuit 72, the multiplied clock N-OUT goes through a delay line 87, a delay line 88 and an output selector 90 in this order, or through the delay line 87, a fixed delay circuit 89 and the output selector 90 in this order, to be delayed by a certain amount of delay and output as the output clock PLL-OUT. The output selector 90 selects one of two delay paths. The delay lines 87 and 88 are digital-type ones.

A phase comparator 85 compares the output clock PHI with the input clock IN in phase, and decrements a count value of a digital counter 86 when the former phase gets behind and conversely increments the count value when gets ahead. When the phases coincide with each other, the count value is kept constant. The digital counter 86 inputs its count value into the digital delay lines 87 and 88. The total amount of delay of the digital delay lines 87 and 88 thereby changes proportionally to the count value.

FIG. 24 is a timing chart showing an operation of the phase synchronous circuit 72. As shown in FIG. 24, when the phase of the output clock PHI gets ahead of that of the input clock IN because the amount D of delay of the output clock PHI with respect to the multiplied clock N-OUT is smaller than an appropriate amount, the count value of the digital counter 86 is incremented by one every one clock cycle of the input clock IN so as to delay the phase of the output clock PHI. As a result, the phase of the output clock PHI is delayed by an increase in the amount D of delay and then coincides with the phase of the input clock IN (in other words, the phase synchronous circuit 72 comes into a lock state).

When the phase of the output clock PHI lags behind that of the input clock IN, conversely, the count value is decremented by one so as to make the phase earlier. That achieves the lock state. Thus, since a control is made so that the phase of the output clock PHI coincides with that of the input clock IN, the clock obtained as the output clock PHI is in synchronization with the input clock IN and multiplied by a predetermined multiplication ratio.

The background-art clock generation circuit 151, however, has the following problems. First, the multiplier circuit 71 has a problem of taking a long time to achieve a lock state. For example, in a typical case where the digital counter 78 is a 10-bit counter (with its count value in 10-bit representation) required is a time period of $2 \times 2^{10} = 2048$ clock cycles at the maximum.

If the lock period is longer, there is a longer waiting time by the lock period until a semiconductor device supplied with the output clock comes back to a normal operation. In cases, for example, where the frequency of the output clock (, the frequency of the input clock, the multiplication ratio or the like) is changed during an operation, or where the oscillation of the multiplier circuit 71 is stopped when the semiconductor device is in a low-power mode and then the oscillation of the multiplier circuit 71 is resumed when the semiconductor device is brought back into a normal operation mode. When the operation frequency of the semiconductor device is often changed or the low-power mode is often used, especially, there arises a disadvantage in terms of performance and power consumption.

The phase synchronous circuit 72 also has a problem of taking a long time to achieve a lock state. For example, in a typical case where the digital counter 86 is an 8-bit counter required is a time period of $2 \times 2^{(8-1)} = 256$ clock cycles at the maximum as the lock period.

In the clock generation circuit 151, after the device comes into the lock state, the multiplier circuit 71 and the phase synchronous circuit 72 operate independently. Therefore, if the cycle of the multiplied clock N-OUT slightly varies with temperature variation, voltage variation or a noise, a phase difference arises between the output clock PLL-OUT and the input clock IN. FIG. 25 is a timing chart showing this operation. As illustrated in FIG. 25, when the cycle of the multiplied clock N-OUT becomes shorter (in other words, the frequency becomes higher) under some influence, the phase of the output clock PLL-OUT consequently goes ahead (time t41).

At this time, the multiplier circuit 71 increases the amount of delay of the delay lines 75 and 76 to enlarge the cycle of the multiplied clock N-OUT. At the same time, the phase synchronous circuit 72 increases the amount of delay of the delay lines 87 and 88 so that the phase of the output clock PLL-OUT may coincide with that of the input clock IN. Though the phase difference between the output clock PLL-OUT and the input clock IN can be cancelled only if the cycle of the multiplied clock N-OUT becomes normal again, since the multiplier circuit 71 increases its amount of delay, the phase of the output clock PLL-OUT lags behind that of the input clock IN at the next clock cycle (time t42).

Thus, there is a problem of jitter in the phase difference between the output clock PLL-OUT and the multiplied clock N-OUT, which is caused by independent controls of the multiplier circuit 71 and the phase synchronous circuit 72 over the amount of delay. When the jitter occurs, both the multiplier circuit 71 and the phase synchronous circuit 72 come into the lock state again, requiring a long time to obtain a stable output clock PLL-OUT.

SUMMARY OF THE INVENTION

The present invention is directed to a clock generation circuit for multiplying a frequency of an input clock by a multiplication ratio to output the same. According to a first aspect of the present invention, the clock generation circuit comprises: a ring oscillator including a variable delay circuit capable of changing the amount of delay step by step within a loop, for outputting an oscillating clock from a part of the loop as an output clock; a phase comparator for comparing two phases of the input clock and a clock obtained by dividing an oscillating clock generated from a part of the loop by the multiplication ratio; a counter for changing a count value defining the amount of delay in such a direction as to cancel a difference between the two phases based on a comparison result of the phase comparator; and an arithmetic unit for calculating a count value corresponding to the amount of delay with which the two phases coincide with each other in response to at least one control signal, to set the same to the counter.

According to a second aspect of the present invention, the clock generation circuit according to the first aspect further comprises: a pulse counter for counting the number of pulses of the output clock, and in the clock generation circuit of the second aspect, the arithmetic unit measures a cycle of the input clock by the number of pulses in response to a reset signal which belongs to the at least one control signal and calculates a count value corresponding to the amount of delay with which the two phases coincide with each other with respect to the cycle which is measured and the multiplication ratio, to set the same to the counter.

According to a third aspect of the present invention, in the clock generation circuit according to the first aspect, the arithmetic unit does not perform calculation or setting until the two phases first coincide with each other after power-on of the clock generation circuit.

According to a fourth aspect of the present invention, in the clock generation circuit according to one of the first to third aspects, the arithmetic unit, in response to a signal which belongs to the at least one control signal and indicates a change of the multiplication ratio, calculates a count value corresponding to the amount of delay with which the two phases coincide with each other with respect to a present cycle of the input clock and a multiplication ratio after being changed as indicated by the signal, to set the same to the counter.

According to a fifth aspect of the present invention, in the clock generation circuit according to one of the first to fourth aspects, the arithmetic unit, in response to a signal which belongs to the at least one control signal and indicates a change of a cycle of the input clock together with a ratio of the cycle after change to that before change, calculates a count value corresponding to the amount of delay with which the two phases coincide with each other with respect to a cycle of the input clock after being changed as indicated by the signal and a present multiplication ratio, to set the same to the counter.

According to a sixth aspect of the present invention, the clock generation circuit according to one of the first to fifth aspects further comprises: a multiplexer for selectively outputting the input clock and the output clock, and in the clock generation circuit of the sixth aspect, the arithmetic unit operates in synchronization with a clock output from the multiplexer and performs an arithmetic operation besides calculation and setting of the count value, and the multiplexer selects the input clock when the arithmetic unit performs calculation and setting of the count value and selects the output clock when the arithmetic unit performs the arithmetic operation.

According to a seventh aspect of the present invention, the clock generation circuit comprises: a ring oscillator including a variable delay circuit capable of changing the amount of delay step by step within a loop, for outputting an oscillating clock from a part of the loop as an output clock; a phase comparator for comparing two phases of the input clock and a clock obtained by dividing an oscillating clock generated from a part of the loop by the multiplication ratio; a pulse counter for counting the number of pulses of the output clock and outputting a signal every time when the number of pulses reaches the multiplication ratio; a selector for selectively outputting an output signal from the phase comparator and an output signal from the pulse counter; a counter receiving an output signal from the selector, for changing a count value defining the amount of delay in such a direction as to cancel a difference between the two phases based on a comparison result of the phase comparator or incrementing the count value every time when the pulse counter outputs the signal during a certain period using a cycle of the input signal as a reference; and a decoder receiving a count value of the counter through a first bit-shifting, for decoding the count value to input the same through a second bit-shifting to the variable delay circuit, wherein the amounts of the first and second bit-shiftings are adjusted so that the two phases coincide with each other.

According to an eighth aspect of the present invention, in the clock generation circuit according to the seventh aspect, the selector selects an output signal from the pulse counter in response to a reset signal and selects an output signal from the phase comparator after completely setting the count value to the variable delay circuit.

According to a ninth aspect of the present invention, in the clock generation circuit according to the second or eighth aspect, the counter initializes the count value in response to the reset signal so that the amount of delay of the variable delay circuit becomes minimum.

According to a tenth aspect of the present invention, the clock generation circuit according to the second, eighth or ninth aspect further comprises: a power-on reset circuit for outputting the reset signal when a power supply voltage to be supplied for the clock generation circuit is lower than a predetermined value.

According to an eleventh aspect of the present invention, the clock generation circuit according to the second, eighth or tenth aspect further comprises: a reset circuit for outputting the reset signal when a certain number of pulses, the number of which corresponds to the multiplication ratio, are not output as an output clock during one cycle of the input clock.

According to a twelfth aspect of the present invention, a clock generation circuit comprises: a ring oscillator including a first variable delay circuit capable of changing the amount of delay step by step within a loop, for outputting an oscillating clock from a part of the loop as a multiplied clock; a first phase comparator for comparing two phases of the input clock and a clock obtained by dividing an oscillating clock generated from a part of the loop by the multiplication ratio; a first counter for changing a first count value defining the amount of delay in such a direction as to cancel a difference between the two phases based on a comparison result of the first phase comparator; a second variable delay circuit for delaying the multiplied clock to be output as an output clock, to allow step-by-step change of the amount of delay; a second phase comparator for comparing two phases of the input clock and the output clock; and a second counter for changing a second count value defining the amount of delay of the second variable delay circuit in such a direction as to cancel a difference between the two phases compared by the second phase comparator only when the two phases compared by the first phase comparator coincide with each other.

According to a thirteenth aspect of the present invention, a clock generation circuit comprises: a ring oscillator including a first variable delay circuit capable of changing the amount of delay step by step within a loop, for outputting an oscillating clock from a part of the loop as a multiplied clock; a first phase comparator for comparing two phases of the input clock and a clock obtained by dividing an oscillating clock generated from a part of the loop by the multiplication ratio; a first counter for changing a first count value defining the amount of delay in such a direction as to cancel a difference between the two phases based on a comparison result of the first phase comparator; a second variable delay circuit for delaying the multiplied clock to be output as an output clock, to allow step-by-step change of the amount of delay; a second phase comparator for comparing two phases of the input clock and the output clock; a second counter for changing a second count value defining the amount of delay of the second variable delay circuit in such a direction as to cancel a difference between the two phases compared by the second phase comparator; and an arithmetic unit for calculating a count value corresponding to the amount of delay with which the two phases compared by the second phase comparator coincide with each other in response to at least one control signal, to set the same to the second counter.

According to a fourteenth aspect of the present invention, the clock generation circuit according to the thirteenth aspect further comprises: a multiplexer for selectively outputting the input clock and the output clock, and in the clock generation circuit of the fourteenth aspect, the arithmetic unit operates in synchronization with a clock output from the multiplexer and performs an arithmetic operation besides calculation and setting of the count value, and the multiplexer selects the input clock when the arithmetic unit performs calculation and setting of the count value and selects the output clock when the arithmetic unit performs the arithmetic operation.

According to a fifteenth aspect of the present invention, a clock generation circuit comprises: a ring oscillator including a first variable delay circuit capable of changing the amount of delay step by step within a loop, for outputting an oscillating clock from a part of the loop as a multiplied clock; a first phase comparator for comparing two phases of the input clock and a clock obtained by dividing an oscillating clock generated from a part of the loop by the multiplication ratio; a first counter for changing a first count value defining the amount of delay in such a direction as to cancel a difference between the two phases based on a comparison result of the first phase comparator; a second variable delay circuit for delaying the multiplied clock to be output as an output clock, to allow step-by-step change of the amount of delay; a second phase comparator for comparing two phases of the input clock and the output clock; a second counter for changing a second count value defining the amount of delay of the second variable delay circuit in such a direction as to cancel a difference between the two phases compared by the second phase comparator and, in response to a control signal, set the count value of the first counter through a first bit-shifting by one bit to the second count value; and a decoder receiving the second count value through a second bit-shifting, for decoding the count value to input the same through a third bit-shifting to the second variable delay circuit, wherein the amounts of the second and third bit-shiftings are adjusted so that the two phases compared by the second phase comparator coincide with each other.

According to a sixteenth aspect of the present invention, in the clock generation circuit according to one of the thirteenth to fifteenth aspects, the control signal is inputted at the time of transition from a state where the two phases compared by the first phase comparator are different from each other to a state where the same coincide with each other.

According to a seventeenth aspect of the present invention, in the clock generation circuit according to one of the thirteenth to fifteenth aspects, the control signal is referred to as a first control signal, and the clock generation circuit further comprises: another arithmetic unit for calculating a count value corresponding to the amount of delay with which the two phases compared by the first phase comparator coincide with each other in response to a second control signal, to set the same to the counter, and in the clock generation circuit of the seventeenth aspect, the first signal is input after the another arithmetic unit sets the count value.

Preferably, in the clock generation circuit according to claim one of the thirteenth to sixteenth aspect, the second counter changes a count value defining the amount of delay of the second variable delay circuit in such a direction as to cancel a difference between the two phases compared by the second phase comparator only when the two phases compared by the first phase comparator coincide with each other.

The present invention is also directed to a semiconductor device. According to an eighteenth aspect of the present invention, the semiconductor device comprises: a clock generation circuit according to one of the first to eighteenth aspects; and a circuit receiving a supply of the output clock from the clock generation circuit and operating in synchronization with the output clock.

In the circuit of the first aspect, since the count value to cancel the difference between the two phases is set to the counter in response to the control signal, a state where the two phases coincide with each other, i.e., a lock state can be achieved in a short time, without waiting for step-by-step increment or decrement of the count value.

In the circuit of the second aspect, since the cycle of the input clock is measured in response to the control signal, it is not necessary to externally indicate a value of the cycle.

In the circuit of the third aspect, the arithmetic unit does not perform calculation or setting until the two phases first coincide with each other after power-on of the clock generation circuit, i.e., until a lock state is achieved. In this period, the count value changes step by step until the lock state is achieved, based on the comparison result of the phase comparator. Therefore, it is possible to avoid a possibility of a longer transition period to the lock state due to setting of inaccurate count value to the counter while the power supply voltage is unstable.

In the circuit of the fourth aspect, since in responses to the signal indicating a change of the multiplication ratio, the count value corresponding to the multiplication ratio after being changed as indicated by the signal is calculated and set to the counter, a lock state under a new multiplication ratio can be immediately achieved when the multiplication ratio is changed.

In the circuit of the fifth aspect, since in responses to the signal indicating a ratio of the cycle of the input clock after change to that before change, the count value corresponding to the cycle of the input clock after being changed is calculated and set to the counter, a lock state under a new cycle of the input clock can be immediately achieved.

In the circuit of the sixth aspect, the arithmetic unit can perform an arithmetic operation besides calculation and setting of the count value and the multiplexer selects the clock to be supplied for the arithmetic unit in accordance with the operation of the arithmetic unit. Therefore, the arithmetic unit such as a CPU provided in a circuit which originally operates in response to supply of the output clock from the clock generation circuit can be effectively used as an arithmetic unit in the clock generation circuit. In other words, the configuration of the clock generation circuit becomes simpler and the chip area becomes smaller.

In the circuit of the seventh aspect, the output from the phase comparator and the output from the pulse counter are selectively input to the counter and the count value of the counter is bit-shifted to an appropriately determined bit width and then transferred to the variable delay circuit. In other words, the function of the arithmetic unit of the circuit of the first aspect is performed equally by the pulse counter, the counter and the decoder. Therefore, a state where the two phases coincide with each other, i.e., a lock state can be achieved in a short time, without waiting for step-by-step increment or decrement of the count value of the counter.

In the circuit of the eighth aspect, since the selector operates in response to the reset signal, an immediate transition to a lock state can be achieved by inputting the reset signal as required.

In the circuit of the ninth aspect, since the count value of the counter is initialized to such a value as to make the amount of delay minimum, the cycle of the input clock can be measured with the minimum pulse width. Therefore, the count value to achieve a lock state can be calculated with high accuracy.

Since the circuit of the tenth aspect comprises the power-on reset circuit, it is possible to avoid a problem of calculation of the count value with low accuracy during a period while the power supply voltage is unstable, for example, immediately after the power supply voltage rises. That prevents a long transition period to a lock state.

Since the circuit of the eleventh aspect comprises the reset circuit, it is possible to avoid an unexpected situation where a lock state is not achieved because the state continues where pulses, the number of which corresponds to the multiplication ratio, are not output in one cycle of the input clock.

Since the circuit of the twelfth aspect comprises the second variable delay circuit, the second phase comparator and the second counter, it is possible not only to multiply the frequency of the input clock but also to obtain the output clock in synchronization with the input clock. Moreover, since the second count value changes only when the two phases compared by the first phase comparator coincide with each other, the problem of jitter in the phase difference between the output clock and the multiplied clock can be solved. That shortens the period from the time when the output clock and the input clock get out of phase with each other to the time when the phases of these clocks coincide again.

Since the circuit of the thirteenth aspect comprises the second variable delay circuit, the second phase comparator and the second counter, it is possible not only to multiply the frequency of the input clock but also to obtain the output clock in synchronization with the input clock. Moreover, since such a count value as to cancel the phase difference between the input clock and the output clock is set to the second counter, a state where the two phases coincide with each other, i.e., a lock state can be achieved in a short time, without waiting for step-by-step increment or decrement of the count value.

In the circuit of the fourteenth aspect, the arithmetic unit can perform an arithmetic operation besides calculation and setting of the count value and the multiplexer selects the clock to be supplied for the arithmetic unit in accordance with the operation of the arithmetic unit. Therefore, the arithmetic unit such as a CPU provided in a circuit which originally operates in response to supply of the output clock from the clock generation circuit can be effectively used as an arithmetic unit in the clock generation circuit. In other words, the configuration of the clock generation circuit becomes simpler and the chip area becomes smaller.

Since the circuit of the fifteenth aspect comprises the second variable delay circuit, the second phase comparator and the second counter, it is possible not only to multiply the frequency of the input clock but also to obtain the output clock in synchronization with the input clock. Moreover, since the count value of the first counter is bit-shifted by one bit and set to the second counter and the count value of the second counter is bit-shifted to an appropriately determined bit width and then transferred to the second variable delay circuit. In other words, the function of the arithmetic unit of the circuit of the thirteenth aspect is performed equally by the second counter and the decoder. Therefore, a state where the two phases coincide with each other, i.e., a lock state can be achieved in a short time, without waiting for step-by-step increment or decrement of the count value of the second counter.

In the circuit of the sixteenth aspect, since the arithmetic unit performs calculation and setting of the count value when the two phases coincide with each other again, there arises no jitter in the phase difference between the output clock and the multiplied clock and the phase of the output clock can immediately coincide with that of the input clock.

In the circuit of the seventeenth aspect, since the arithmetic unit calculates the count value and set it to the second counter after the count value is completely set to the first counter by another arithmetic unit, the two phases of the output clock and the multiplied clock can immediately coincide with each other after the amount of delay of the first variable delay circuit largely varies.

Since the device of the eighteenth aspect comprises a circuit operating in synchronization with the output clock supplied by the clock generation circuit of one of the first to seventeenth aspects, a stable operation of the circuit can be immediately achieved.

An object of the present invention is thus to provide a clock generation circuit capable of reducing a transition time period until a stable output clock is obtained, and further provide a semiconductor device comprising the clock generation circuit.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a block diagram of a PLL circuit shown in FIG. 1;

DESCRIPTION OF THE PREFERRED EMBODIMENTS

1. The First Preferred Embodiment

First, a clock generation circuit in accordance with the first preferred embodiment of the present invention will be discussed.

1.1. Overall Structure of Device

Figure 1:
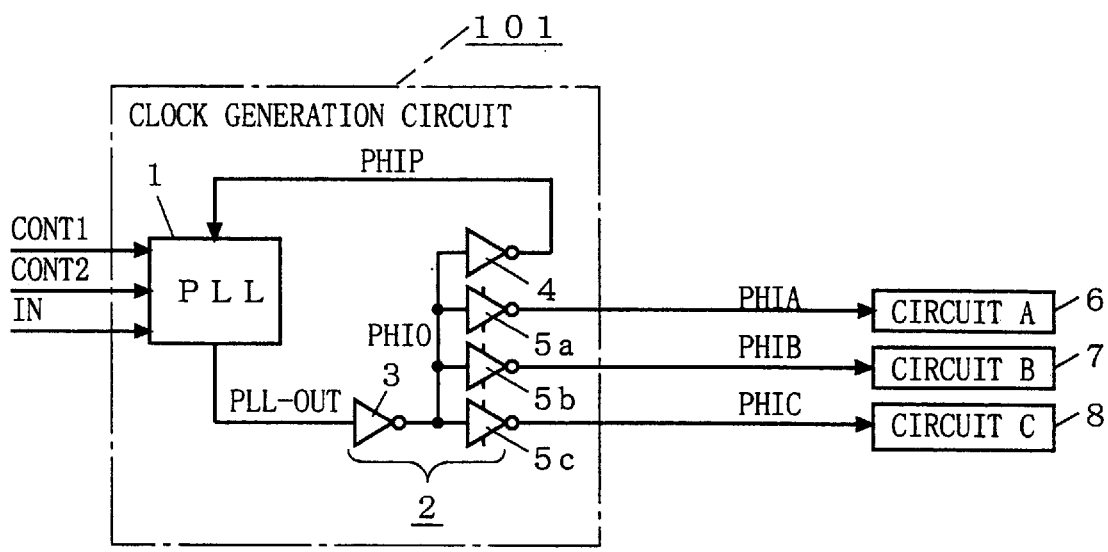
FIG. 1 is a block diagram of a clock generation circuit in accordance with a first preferred embodiment.

FIG. 1 is a block diagram showing a configuration of a clock generation circuit 101 in accordance with a first preferred embodiment. The clock generation circuit 101 comprises a PLL circuit 1 and an output buffer 2. The PLL circuit 1 is a digital-type one, and multiplies the input clock IN and outputs it as the output clock PLL-OUT.

The output buffer 2 comprises, for example, inverters 3, 4, 5a, 5b and 5c. The inverter 3 inverts the output clock PLL-OUT and outputs it as an output PHIO. The inverters 4 and 5a to 5c invert the output clock PHIO and output the inverted clocks as output clocks PHIP, PHIA, PHIB and PHIC, respectively. The output clocks PHIA, PHIB and PHIC are supplied for various circuits 6, 7 and 8, respectively. The inverters 5a to 5c selectively output the output clocks or fix the output to one level (for example, low level) in response to a selection signal. For example, the inverter 5a outputs the output clock PHIA when the circuit 6 operates and outputs a low-level signal when the circuit 6 stops operating.

On the other hand, the inverter 4 always outputs the output clock. The output clock PHIP from the inverter 4 is fed back to the PLL circuit 1. The inverter 4 is so configured as to have the same characteristics (e.g., the amount of delay) as the inverters 5a to 5c in outputting the output clock. Therefore, the phases of the four output clocks PHIP, PHIA, PHIB and PHIC coincide with one another. In other words, the output clock PHIP serves as a monitor signal for the output clocks PHIA, PHIB and PHIC to be supplied outside.

The PLL circuit 1 compares the input clock IN and the fed-back output clock PHIP in phase and controls the phase of the output clock PLL-OUT to cancel the phase difference. Thus obtained are clocks in synchronization with the input clock IN, with their frequencies multiplied, as the output clocks PHIP, PHIA, PHIB and PHIC. The PLL circuit 1 is so configured as to be capable of setting and changing the multiplication ratio and changing the frequency of the input clock IN on the basis of externally-received control signals CONT1 and CONT2. This will be discussed below in detail.

1.2. Outline of Multiplier Circuit

FIG. 2 is a block diagram showing an internal configuration of the PLL circuit 1. The PLL circuit 1 comprises a multiplier circuit 10 and a phase synchronous circuit 11. The multiplier circuit 10 multiplies the frequency of the input clock IN by a determined multiplication ratio, and outputs the multiplied clock as the multiplied clock N-OUT. The phase synchronous circuit 11 delays the multiplied clock N-OUT by an appropriate amount of delay so that the output clock PHIP may come into synchronization with the input clock IN, and outputs the delayed clock as the output clock PLL-OUT.

The multiplier circuit 10 comprises a ring oscillator including a digital delay line 16, a fixed delay circuit 17, an OR circuit 21 and an AND circuit 22 in its loop. The digital delay line 16 is configured as a variable delay circuit, comprising a plurality of delay elements which can be selectively cascaded. The amount of delay can be changed step by step, in proportion to the number of cascaded delay elements. The fixed delay circuit 17 includes an inverter for inverting the level of a signal.

Thus, in the ring oscillator, the amount of delay is variable. Further, the ring oscillator is configured as such a negative feed-back loop as to invert the level of a signal in a single cycle along the loop. The ring oscillator therefore oscillates, and half of the oscillation cycle, i.e., half cycle, corresponds to the amount of delay in the single cycle.

The amount of delay of the digital delay line 16 depends on the count value of a counter 13. The counter 13 is configured as, for example, a 10-bit digital counter. The count value of the counter 13 in binary representation is decoded by a decoder 15 and then input to the digital delay line 16. As a result, the amount of delay of the digital delay line 16 varies in proportion to the count value of the counter 13. Therefore, the cycle of the multiplied clock N-OUT varies in a linear relation with the count value of the counter 13. Moreover, since the counter 13 is a digital counter and its count value an integer, the cycle of the multiplied clock N-OUT varies step by step.

The counter 13 is connected to a phase comparator 18 and an arithmetic unit 12. The phase comparator 18 receives the delay clock DL-OUT obtained from an output of the digital delay line 16 included in the ring oscillator and a two-division clock obtained by dividing the input clock IN by two with a two-divider circuit 19.

The phase comparator 18 compares the delay clock DL-OUT (more exactly, a clock divided by the multiplication ratio of the delay clock DL-OUT) with the input clock IN in phase every two cycles of the input clock IN, and decrements the count value of the counter 13 when the phase of the delay clock DL-OUT gets behind and increments when gets ahead. When the phases coincide with each other, the count value is kept constant. Specifically, the phase comparator 18 increments or decrements the count value of the counter 13 so that the phase difference may be cancelled, in other words, the multiplier circuit 10 may come into a lock state.

The arithmetic unit 12 calculates in advance a count value such that the phases of the delay clock DL-OUT and the input clock IN may coincide with each other, in other words, the multiplier circuit 10 may come into a lock state when the PLL circuit 1 starts operating, the multiplication ratio is changed or the frequency of the input clock IN is changed, and sets the calculated count value to the counter 13 as an initial value. Whether the count value of the counter 13 is updated by the phase comparator 18 or the arithmetic unit 12 depends on the operation mode of the multiplier circuit 10.

As discussed later, a plurality of operation modes are prepared for the operation of the multiplier circuit 10, and the operation of the multiplier circuit 10 changes among the operation modes. A mode control unit 50 controls the operation modes, outputting a mode signal MD representing the operation mode. The arithmetic unit 12 and the counter 13 perform different operations for the operation modes in accordance with the mode signal MD.

Figure 21:
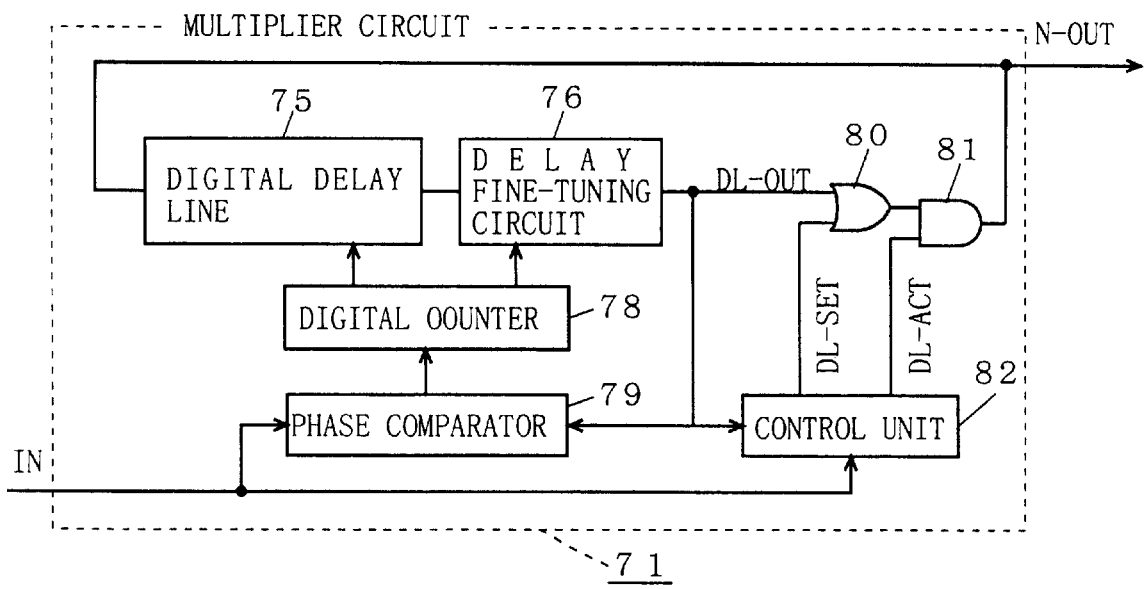
FIG. 21 is a block diagram of a multiplier circuit shown in FIG. 20.

The multiplier circuit 10 generates the signals DL-ACT and DL-SET in order to achieve a predetermined multiplication ratio, like the background-art multiplier circuit 71 (see FIG. 21), and inputs the signals to one of inputs of the AND circuit 22 and the OR circuit 21. The signal DL-ACT is generated by a pulse counter 9, a gate circuit 27 and a flip flop (hereinafter abbreviatedly referred to as "FF"). The signal DL-SET is generated by a FF24.

When the signal DL-ACT is negated, the multiplied clock N-OUT is forcefully set to low level. When the signal DL-ACT is asserted and the signal DL-SET is asserted, the multiplied clock N-OUT is forcefully set to high level. Only when the signal DL-ACT is asserted and the signal DL-SET is negated, the ring oscillator oscillates.

In the pulse counter 9, its set input receives the input clock IN, its clock input receives the multiplied clock N-OUT and its reset input receives the signal DL-ACT. As a result, the pulse counter 9 counts the number of pulses of the multiplied clock N-OUT every one clock cycle of the input clock IN only while the signal DL-ACT is asserted. The pulse counter 9 outputs a pulse-like signal C1 when the count value reaches the multiplication ratio.

The gate circuit 27 selectively transfers the signal C1 to the reset input of the FF 23 as a signal C2 in accordance with the mode signal MD. The set input of the FF 23 receives the input clock IN, and the FF 23 thereby outputs the signal DL-ACT as an output signal. In the FF 24, its set input receives the input clock IN and its reset input receives the delay clock DL-OUT. As a result, the FF 24 outputs the signal DL-SET as an output signal.

The multiplier circuit 10 further comprises a latch 25, a gate circuit 28 and an OR circuit 26 for generating a reset signal PLL-RST. In the latch 25, its data input receives the signal DL-ACT and its clock input receives the input clock IN through the gate circuit 28. The OR circuit 26 outputs the logical sum of the output signal of the latch 25 and an external reset EX-RST input from the outside of the PLL circuit 1 as a reset signal PLL-RST. The reset signal PLL-RST is inputted to the mode control unit 50 and the pulse counter 9. The gate circuit 28 has the same configuration as the gate circuit 27, and selectively transfers the input clock IN to the clock input of the latch 25 in accordance with the mode signal MD.

The multiplier circuit 10 further comprises a lock detecting unit 20 for detecting if the multiplier circuit 10 is in a lock state based on the comparison result of the phase comparator 18. The lock detecting unit 20 outputs a lock signal LK representing a detection result. The lock signal LK is used for control of the phase synchronous circuit 11 as discussed later.

The control signal CONT1 input from the outside of the PLL circuit 1 represents the multiplication ratio and is input to the pulse counter 9, the arithmetic unit 12 and the mode control unit 50. The control signal CONT2 externally input like the control signal CONT1 indicates a change of the frequency of the input clock IN or a change of the multiplication ratio, and is input to the arithmetic unit 12 and the mode control unit 50.

1.3. Operation Mode

Figures 3, 4:
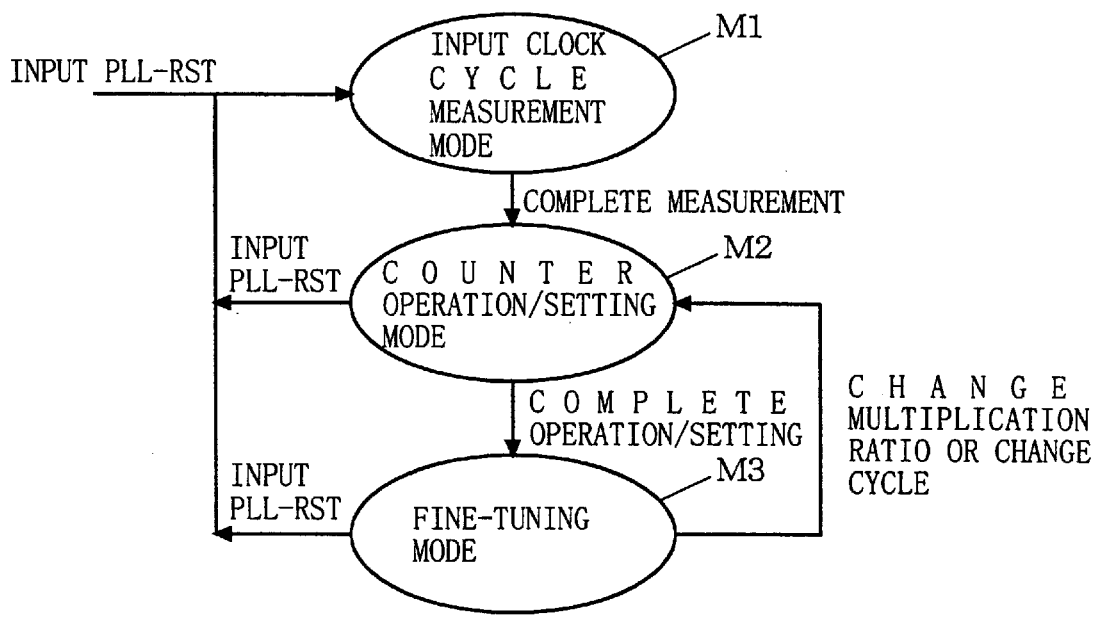
FIG. 3 is a state transition diagram of a multiplier circuit shown in FIG. 2.
FIG. 4 is an explanatory diagram of mode signals output from a mode control unit shown in FIG. 2.

FIG. 3 is a state transition diagram of the multiplier circuit 10. As shown in FIG. 3, the operation mode of the multiplier circuit 10 changes among three modes, i.e., an input clock cycle measurement mode M1, a counter operation/setting mode M2 and a fine-tuning mode M3. After the power turns on and the multiplier circuit 10 starts operating, for example, when the reset signal PLL-RST is input through the supply of the external reset EX-RST, the mode control unit 50 responds to it, setting the operation mode into the input clock cycle measurement mode M1. In the input clock cycle measurement mode M1, the cycle of the input clock IN is measured.

After the cycle of the input clock is completely measured, the mode control unit 50 changes the operation mode into the counter operation/setting mode M2. In the counter operation/setting mode M2, the arithmetic unit 12 calculates the count value of the counter 13 such that the multiplier circuit 10 may come into a lock state and sets the count value to the counter 13 as an initial value. After the initial value is completely set, the mode control unit 50 changes the operation mode into the fine-tuning mode M3 which is a normal operation mode. In the fine-tuning mode M3, the count value of the counter 13 is controlled by the phase comparator 18.

When the operation is in the fine-tuning mode M3 and the control signal CONT2 indicates the change of the multiplication ratio or the change of the cycle of the input clock IN, the mode control unit 50 changes the operation mode into the counter operation/setting mode M2. Then, a count value of the counter 13 corresponding to a new multiplication ratio indicated by the control signal CONT1 or a new cycle of the input clock IN indicated by the control signal CONT2 is calculated and set to the counter 13 as a new initial value. In other words, the count value of the counter 13 is updated by the calculated value. When the count value of the counter 13 is completely updated, the mode control unit 50 changes the operation mode into the fine-tuning mode M3 again.

Further, when the reset signal PLL-RST is inputted, even if the operation is in the counter operation/setting mode M2 or the fine-tuning mode M3, the mode control unit 50 changes the operation mode into the input clock cycle measurement mode M1. The mode signal MD output by the mode control unit 50 consists of, for example, 2-bit components (mode signal components MD1 and MD2), as shown in FIG. 4, representing three operation modes.

1.4. Cycle Measurement Mode

Figure 5:
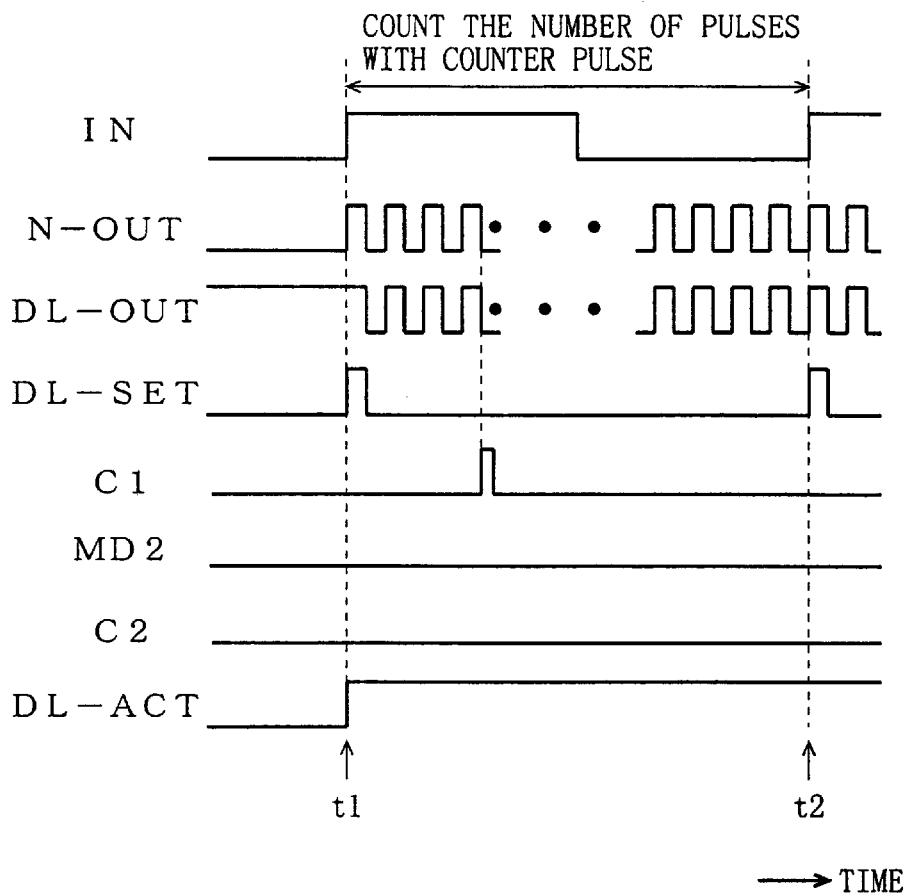
FIG. 5 is a timing chart in a cycle measurement mode shown in FIG. 3.

FIG. 5 is a timing chart showing the operation of the multiplier circuit 10 in the input clock cycle measurement mode M1. This operation mode starts after the reset signal PLL-RST is input and is removed. In this operation mode, the mode control unit 50 resets the counter 13 and sets the count value at the minimum value. Until the first input clock IN rises at time t1 after the operation mode changes to the input clock cycle measurement mode M1, both the signals DL-ACT and DL-SET are negated. Therefore, until the time t1, the multiplied clock N-OUT is fixed to low level and consequently the delay clock DL-OUT is fixed to high level.

When the input clock IN rises at the time t1, the signals DL-ACT and DL-SET are asserted. As a result, the multiplied clock N-OUT is forcefully set in high level. The multiplied clock N-OUT is delayed by the total amount of delay (delay time) of the digital delay line 16 and the fixed delay circuit 17 and inverted in level, appearing as a delay clock DL-OUT. Therefore, the delay clock DL-OUT changes from high level to low level at a time point behind the time t1 by this amount of delay. When the delay clock DL-OUT is changed into low level, the signal DL-SET is negated.

When the signal DL-SET is negated, the delay clock DL-OUT goes through the OR circuit 21 and the AND circuit 22 and is outputted as the multiplied clock N-OUT. In other words, the ring oscillator is enabled to oscillate. That provides a periodic clock pulse whose half cycle (i.e., pulse width) is the delay time of the ring oscillator as the multiplied clock N-OUT. Since the count value of the counter 13 is set at the minimum value (i.e., zero), the pulse width of the multiplied clock N-OUT is the minimum value.

When the input clock IN rises at the time t1, the pulse counter 9 is set. The pulse counter 9 thereby counts the number of pulses of the multiplied clock N-OUT after the time t1.

The gate circuit 27 passes the signal C1 as the signal C2 only when the operation is in the fine-tuning mode M3. For this, the gate circuit 27 has only to be configured as an AND circuit which calculates the logic product between the signal C1 and the mode signal component MD2 and outputs it as the signal C2, for example. In the case of FIG. 5, the gate circuit 27 is configured as an AND circuit. Therefore, in the input clock cycle measurement mode M1 where the mode signal component MD2 is zero, the signal C2 keeps low level regardless of the signal C1.

Though the pulse counter 9 outputs the signal C1 every time when the count value reaches the multiplication ratio set by the control signal CONT1, the signal DL-ACT keeps high level regardless of the signal C1. Therefore, the pulse counter 9 continuously measures the number of pulses of the multiplied clock N-OUT without being reset.

The mode control unit 50 monitors the input clock IN, and changes the operation mode into the counter operation/setting mode M2 when the input clock IN rises again from the time t1 to the one clock cycle later, time t2. The count value of the pulse counter 9 at time t2 is transferred to the arithmetic unit 12. The count value corresponds to the cycle of the input clock IN measured in a unit of the cycle of the ring oscillator. Since the cycle of the ring oscillator is set at the minimum value, the cycle of the input clock IN can be measured with high accuracy. Further, the measurement of cycle may be performed, for example, over two cycles of the input clock IN instead of only one cycle.

1.5. Counter Operation/Set Measurement Mode

Figure 6:
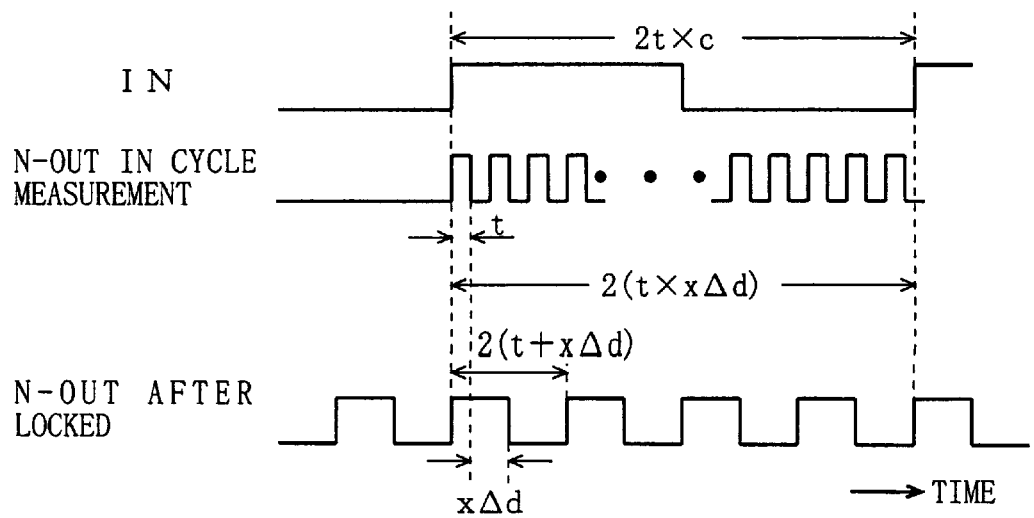
FIG. 6 is an operational explanatory diagram of an operation/setting mode shown in FIG. 3.

In the counter operation/setting mode M2, the initial value of the count value to be set to the counter 13 is calculated in the following procedure. FIG. 6 is a timing chart showing the operation for calculating the initial value. Variables in FIG. 6 are defined as:

c: the number of pulses counted in the input clock cycle measurement mode M1;
t: half cycle of the multiplied clock N-OUT when the count value of the counter 13 is zero;
$\Delta d$: increment in the amount of delay of the digital delay line 16 every one increment of the count value of the counter 13;
n: a multiplication ratio; and
x: an initial value to be set to the counter 13.

Using these variables, as shown in FIG. 6, the following relation is held:
(the cycle of the input clock IN)=2t×c;
(the cycle of the multiplied clock N-OUT after locked)=2(t+x$\Delta d$); and
(the cycle of the input clock IN)=(the cycle of the multiplied clock N-OUT after locked)×n.

Therefore, the initial value x is expressed as:

$$x=(t/\Delta d)\cdot(c/n-1)=(a/n)\cdot c-a \qquad (1)$$

where variable a=t/$\Delta d$.

The arithmetic unit 12 calculates the initial value x in accordance with Eq. 1. The calculated initial value x is set to the counter 13. Therefore, from the next clock cycle on (i.e., from the next rise of the input clock IN), the multiplier circuit 10 is in a lock state. At the same time, the mode control unit 50 changes the operation mode into the fine-tuning mode M3.

Thus, in the multiplier circuit 10, since the count value to achieve the lock state is set to the counter 13 as the initial value immediately after the start of operation, the lock state can be immediately achieved. It takes only several clock cycles to perform the input clock cycle measurement mode M1 and the counter operation/setting mode M2. Therefore, when several clock cycles pass after the reset signal PLL-RST is input, the multiplier circuit 10 outputs a stable output clock PLL-OUT.

The arithmetic unit 12 can be configured by hardware, without using software. The variable a is determined by the multiplier circuit 10, and by appropriately determining the amount of delay of the fixed delay circuit 17, the half cycle t can be set as $$t=(\text{multiple of } n)\cdot\Delta d$$

The variables a and a/n can be thereby integers. In this case, the arithmetic unit 12 can calculate the initial value x by simple product operation and sum operation. This allows a simple configuration of the arithmetic unit 12.

1.6. Fine-Tuning Mode

Figure 7:
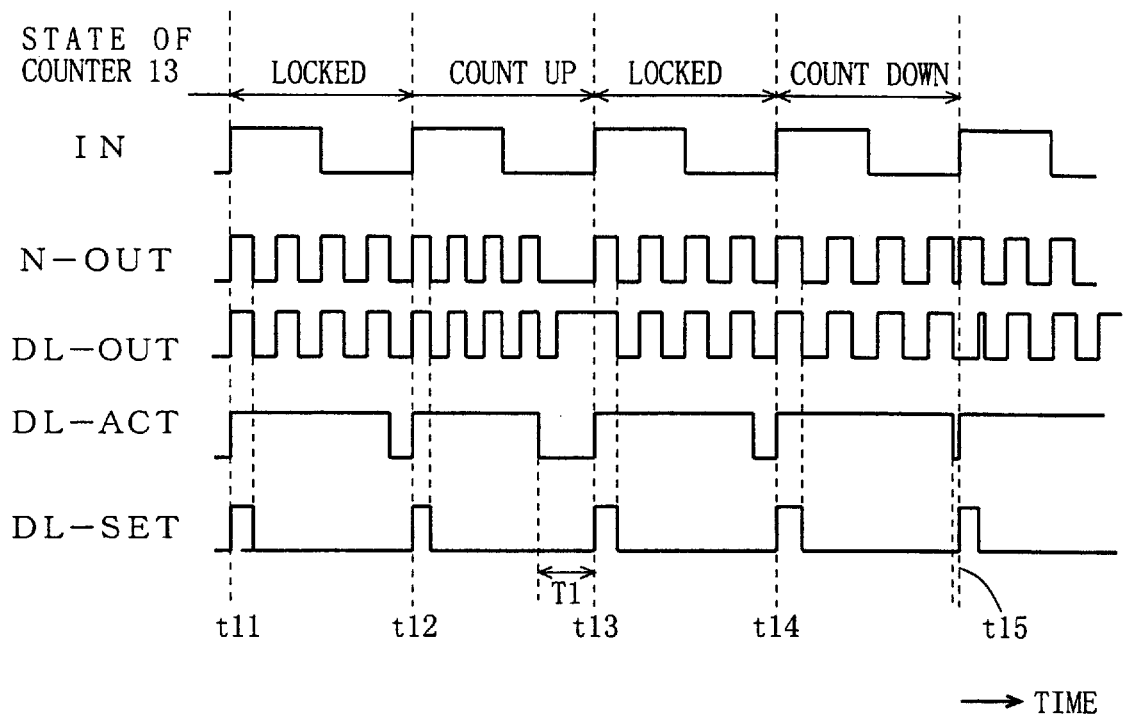
FIG. 7 is a timing chart in a fine-tuning mode shown in FIG. 3.

In the fine-tuning mode M3, the arithmetic unit 12 is stopped. Therefore, the count value of the counter 13 is controlled only by the output signal of the phase comparator 18. FIG. 7 is a timing chart showing the operation in the counter operation/setting mode M2 with the multiplication ratio set at four.

In the fine-tuning mode M3, the gate circuit 27 passes the signal C1 and transfers it as the signal C2 to the reset input of the FF 23. Therefore, when the number of pulses of the multiplied clock N-OUT reaches four (multiplication ratio) in one clock cycle, the signal DL-ACT is negated. In other words, when the multiplied clock N-OUT rises four times in one clock cycle, the signal DL-ACT is negated and kept until the next clock cycle starts. While the signal DL-ACT is negated, as discussed above, the multiplied clock N-OUT is fixed to low level and the count operation of the pulse counter 9 is stopped.

The delay clock DL-OUT rises behind the delay time of the digital delay line 16 and the fixed delay circuit 17 from the fall of the multiplied clock N-OUT after the signal DL-ACT is negated. In the lock state, this rise time coincides with the start time of the next clock cycle, i.e., the next rise time of the input clock IN. This lock state is achieved from the time t11 to time t12 and from time t13 to time t14 in FIG. 7.

On the other hand, when the pulse width of the multiplied clock N-OUT (pulse width of the delay clock DL-OUT) is short since the amount of delay of the ring oscillator is low, the rise of the delay clock DL-OUT after the signal DL-ACT is negated gets ahead of the next rise time of the input clock IN. In other words, the phase of the delay clock DL-OUT gets ahead of that of the input clock IN. This state appears in the clock cycle from the time t12 to the time t13.

When the pulse width of the multiplied clock N-OUT is long since the amount of delay of the ring oscillator is high, conversely, the rise of the delay clock DL-OUT after the signal DL-ACT is negated lags behind the next rise time of the input clock IN. In other words, the phase of the delay clock DL-OUT lags behind that of the input clock IN. This state appears in the clock cycles from the time t14 to time t15.

The phase comparator 18 monitors the relation between the rise time of the input clock IN and the first rise time of the delay clock DL-OUT after the signal DL-ACT is negated, and based on the monitored result determines the relation between the phases of the two clocks. This means that the phase comparator 18 compares the phase of divided clock which is obtained by dividing the delay clock DL-OUT (substantially equal to the multiplied clock N-OUT) by four (multiplication ratio) with that of the input clock IN. When the phases coincide with each other, in other words, when the multiplier circuit 10 is in a lock state, the phase comparator 18 does not change the count value of the counter 13. Therefore, properly speaking, the lock state should be kept.

As shown in the clock cycle from the time t12 to the time t13, however, when the pulse width of the multiplied clock N-OUT is made shorter by some effect such as temperature variation, voltage variation or noise, the phase comparator 18 judges that the phase of the delay clock DL-OUT goes ahead of that of the input clock IN and consequently the counter 13 increments its count value by one every one clock cycle. Therefore, the pulse width of the delay clock DL-OUT gradually becomes longer and in general, the multiplier circuit 10 returns to the lock state after a plurality of clock cycles (after one clock cycle in FIG. 7).

As shown in the clock cycles from the time t14 to the time t15, when the pulse width of the multiplied clock N-OUT is made longer, the phase comparator 18 judges that the phase of the delay clock DL-OUT lags behind that of the input clock IN and consequently the counter 13 decrements its count value by one every one clock cycle. Therefore, the pulse width of the delay clock DL-OUT gradually becomes shorter and in general, the multiplier circuit 10 returns to the lock state after a plurality of clock cycles.

Thus, in the fine-tuning mode M3, even if the multiplier circuit 10 is out of the lock state because of variation in pulse width of the multiplied clock N-OUT, the multiplier circuit 10 can return to the lock state by the function of the phase comparator 18. Specifically, as the multiplied clock N-OUT, a clock signal whose frequency is multiplied by the multiplication ratio of the input clock IN is stably output.

1.7. Change of Multiplication Ratio

Next, an operation of the multiplier circuit 10 for changing the multiplication ratio will be discussed. To change the multiplication ratio, the control signal CONT2 is inputted. The control signal CONT2 is, for example, a signal of 9-bit width [0:8] and when the multiplication ratio is changed, the zeroth bit [0] is set at a predetermined value (e.g., 1). The control signal CONT1 represents a new value of the multiplication ratio.

Figure 8:
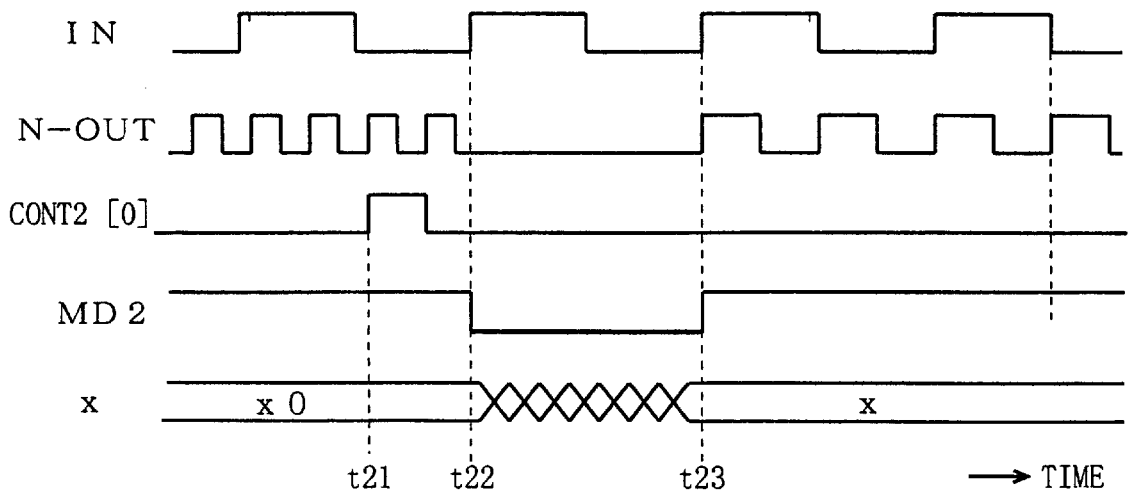
FIG. 8 is a timing chart in an operation/setting mode shown in FIG. 3.

FIG. 8 is a timing chart showing the operation of the multiplier circuit 10 associated with change of multiplication ratio. At time t21, when 1 is inputted to the zeroth bit [0], the mode control unit 50 changes the operation mode into the counter operation/setting mode M2 in the next clock cycle (time t22 to time t23). Then, the arithmetic unit 12 calculates a count value to be set to the counter 13 as a new initial value in accordance with a new multiplication ratio represented by the control signal CONT1. The new initial value is calculated in the following procedure.

Using the following variables, c: the number of pulses counted in the input clock cycle measurement mode M1;

t: half cycle of the multiplied clock N-OUT when the count value of the counter 13 is zero;

$\Delta d$: increment in the amount of delay of the digital delay line 16 every one increment of the count value of the counter 13;

n: a multiplication ratio before change;

N: a multiplication ratio after change;

x0: a count value of the counter 13 before change; and x: a new initial value to be set to the counter 13, the following relation is obtained from Eq. 1, $$x0=(t/\Delta d)\cdot(c/n-1);$$

and $$x=(t/\Delta d)\cdot(c/N-1)$$

Therefore, when a variable j=N/n, the following equation is obtained:

$$x=\{t/(j\cdot\Delta d)\}-(t/\Delta d)+(x0/j) \quad (2)$$

The arithmetic unit 12 calculates an initial value x based on Eq. 2. The calculated initial value x is set to the counter 13. That brings the multiplier circuit 10 into a lock state under a new multiplication ratio N from the next clock cycle on (from the time t23). At the same time, the mode control unit 50 changes the operation mode into the fine-tuning mode M3. Thus, in the multiplier circuit 10, since the count value to achieve the lock state is set to the counter 13 as the initial value even when the multiplication ratio is changed, the lock state can be immediately achieved.

1.8. Change of Clock Cycle

Next, an operation of the multiplier circuit 10 for changing the frequency of the input clock IN will be discussed. Also to change the clock cycle, the control signal CONT2 is input. When the control signal CONT2 is, for example, a signal of 9-bit width [0:8], in order to instruct a change of clock cycle, a signal ranging from the first to eighth bits [1:8] represents the ratio i of the clock cycle after change to the clock cycle before change.

Figures 9, 10:
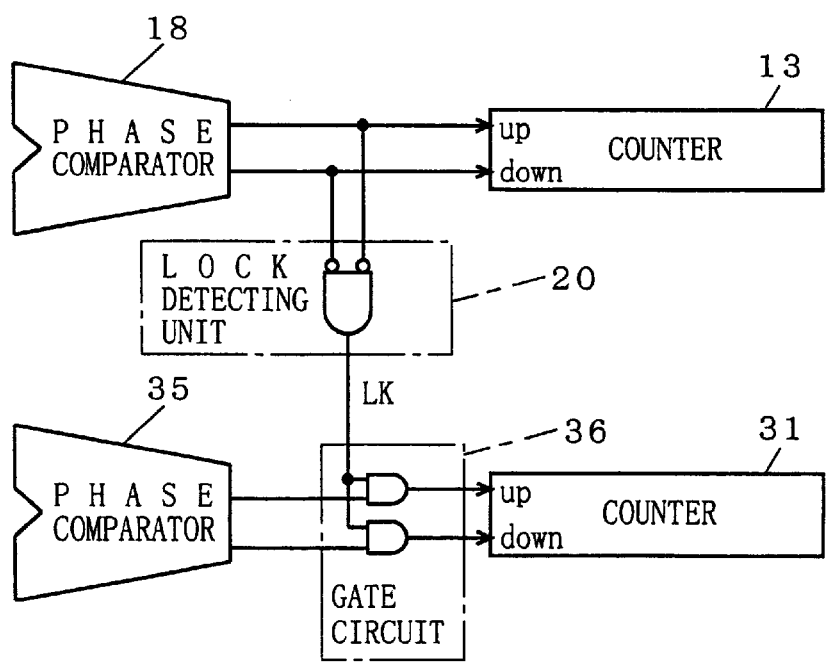
FIG. 9 is an explanatory diagram showing exemplary values of a control signal CONT2 shown in FIG. 2.
FIG. 10 is a circuit diagram of a lock detecting unit and a gate circuit shown in FIG. 2.

FIG. 9 is an explanatory diagram showing exemplary values of the signal ranging from the first to eighth bits [1:8] in a form of table. In the case of FIG. 9, one of the bits [1:8] of the signal is set at "1" to represent a value of the ratio i. For example, when the ratio i is ⅓, the sixth bit is set at "1".

When the value representing the ratio i is inputted to the first to eighth bits [1:8] of the control signal CONT2, the mode control unit 50 changes the operation mode into the counter operation/setting mode M2. Then, the arithmetic unit 12 calculates a count value to be set to the counter 13 as a new initial value in accordance with a new clock cycle represented by the ratio i. Substituting the ratio i for the ratio j in Eq. 2, the new initial value is obtained as:

$$x=\{t/(i\cdot\Delta d)\}-(t/\Delta d)+(x0/i) \quad (3)$$

where x0: a count value of the counter 13 before change; and x: a new initial value to be set to the counter 13.

The arithmetic unit 12 calculates an initial value x based on Eq. 3. The calculated initial value x is set to the counter 13. That brings the multiplier circuit 10 into a lock state under a new multiplication ratio N from the next clock cycle on. At the same time, the mode control unit 50 changes the operation mode into the fine-tuning mode M3. Thus, in the multiplier circuit 10, since the count value to achieve the lock state is set to the counter 13 as the initial value even when the clock cycle is changed, the lock state can be immediately achieved.

1.9. Reset

Now, operations of the latch 25 and the gate circuit 28 will be discussed. The gate circuit 28, like the gate circuit 27, passes the input clock IN only when the operation is in the fine-tuning mode M3 and transfers it to the clock input of the latch 25. For this, the gate circuit 28 has only to be configured as an AND circuit for outputting a logical product of the input clock IN and the mode signal component MD2.

In the fine-tuning mode M3, no signal DL-ACT negated during one clock cycle means that a specified number of pulses, the number of which corresponds to the multiplication ratio (e.g., four), are not output as the multiplied clock N-OUT during one clock cycle. In this case, the latch 25 outputs a high-level signal. Since the reset signal PLL-RST is thereby asserted, the operation mode is forcefully changed to the input clock cycle measurement mode M1. Then, the count value of the counter 13 is calculated again. This surely avoids an unexpected situation where the signal DL-ACT is kept asserted.

1.10. Phase Synchronous Circuit

Next, referring back to FIG. 2, a configuration and an operation of the phase synchronous circuit 11 will be discussed. In the phase synchronous circuit 11, the multiplied clock N-OUT, going through a digital delay line 33 and a fixed delay circuit 34, is delayed by a certain amount of delay and outputted as an output clock PLL-OUT. The digital delay line 33, like the digital delay line 16, is configured as a variable delay circuit, comprising a plurality of delay elements which can be selectively cascaded. The amount of delay can be changed step by step, in proportion to the number of cascaded delay elements.

The amount of delay of the digital delay line 33 depends on the count value of a counter 31. The counter 31 is configured as, for example, an 8-bit digital counter. The count value of the counter 31 in binary representation is decoded by a decoder 32 and then inputted to the digital delay line 33. As a result, the amount of delay of the digital delay line 33 varies in proportion to the count value of the counter 31. Therefore, the amount of delay of the output clock PLL-OUT relative to the multiplied clock N-OUT varies in a linear relation with the count value of the counter 31. Moreover, since the counter 31 is a digital-type one and its count value is integer, the amount of delay of the output clock PLL-OUT varies step by step.

The counter 31 is connected to a phase comparator 35 and an arithmetic unit 30. The phase comparator 35 is connected to the counter 31 through the gate circuit 36. The phase comparator 35 compares the output clock PHIP with the input clock IN in phase every one cycle of the input clock IN, and increments the count value of the counter 31 when the phase of the output clock PHIP gets ahead and decrements when gets behind. When the phases coincide with each other, the count value is kept constant. Specifically, the phase comparator 35 increments or decrements the count value of the counter 31 so that the phase difference may be cancelled, in other words, the phase synchronous circuit 11 may come into a lock state.

The gate circuit 36 selectively transfers an output signal of the phase comparator 35 to the counter 31 in accordance with the lock signal LK outputted from the lock detecting unit 20. In other words, only when the multiplied circuit 10 is in a lock state, the gate circuit 36 transfers the output signal of the phase comparator 35 to the counter 31. For this, the gate circuit 36 has only to comprise an AND circuit for outputting a logical product of the output signal of the phase comparator 35 and the lock signal LK, as shown in FIG. 10.

Thus, when the operation of the multiplier circuit 10 is out of the lock state, update of the count value of the counter 31 by the phase comparator 35 is stopped. That solves a problem of jitter which occurs in the background-art clock generation circuit 151.

The arithmetic unit 30 calculates in advance a count value such that the output clock PHIP and the input clock IN may coincide in phase with each other, in other words, such that the phase synchronous circuit 11 may come into a lock state immediately after the count value of the counter 13 in the multiplier circuit 10 is updated by the arithmetic unit 12, in other words, immediately after the operation mode changes from the counter operation/setting mode M2 to the fine-tuning mode M3, and set the calculated count value to the counter 31 as an initial value. In more detail, the arithmetic circuit 30 starts operation at the point of time when the lock state of the multiplier circuit 10 is first detected by the lock detecting unit 20 after the operation mode of the multiplier circuit 10 changes to the counter operation/setting mode M2. Thus, whether the count value of the counter 31 is updated by the phase comparator 35 or the arithmetic unit 30 depends on the operation mode of the multiplier circuit 10.

Figure 11:
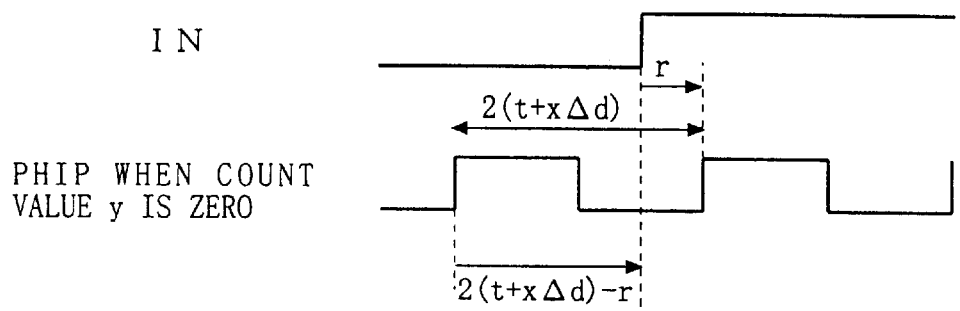
FIG. 11 is an operational explanatory diagram of a phase synchronous circuit shown in FIG. 2.

The initial value of the counter 31 is calculated based on the count value of the counter 13 in the following procedure. Assuming that x: a count value of the counter 13;
t: half cycle of the multiplied clock N-OUT when the count value of the counter 13 is zero;
$\Delta d$: increment in the amount of delay of the digital delay line 16 every one increment of the count value of the counter 13;
r: phase difference between the output clock PHIP and the input clock IN when the count value of the counter 31 is zero;
y: an initial value to be set to the counter 31; and
$\Delta u$: increment in the amount of delay of the digital delay line 33 every one increment of the count value of the counter 31, as is clear from the timing chart of FIG. 11, the following relation is held:

$$y \cdot \Delta u = 2 \cdot (t + x \cdot \Delta d) - r$$

From the above equation, the following equation is obtained:

$$y = 2 \cdot x(\Delta d/\Delta u) - \{(r - 2 \cdot t)\} \quad (4)$$

If the digital delay line 16 and the digital delay line 33 have the same increment in the amount of delay, $$\Delta u = \Delta d$$

and Eq. 4 is thereby simply expressed as $$y = 2 \cdot x - \{(r - 2 \cdot t)/\Delta d\} \quad (5)$$

The arithmetic unit 30 calculates the initial value y based on Eq. 4 or 5. The calculated initial value y is set to the counter 31. The phase synchronous circuit 11 thereby comes into a lock state, for example, from the next clock cycle on. Therefore, both the multiplier circuit 10 and the phase synchronous circuit 11 immediately come into the lock state when the PLL circuit 1 starts operating, when the multiplication ratio is changed and when the clock cycle is changed. In other words, a clock in synchronization with the input clock IN, with its frequency multiplied, can be obtained as output clocks PHIP, PHIA, PHIB and PHIC after several clock cycles required for cycle measurement or arithmetic operation, which is too much shorter than in the background-art clock generation circuit 151.

The arithmetic unit 30 can be configured by hardware, without using software, like the arithmetic unit 12. The variable r depends on the phase synchronous circuit 11, and can be set by appropriately setting the amount of delay of the fixed delay circuit 34 so that the following equation may be held, using an integer k:

$$(r-2 \cdot t)/\Delta d = k$$

In this case, Eq. 5 can be more simply expressed as:

$$y = 2 \cdot x - k \quad (6)$$

The arithmetic unit 30 can thereby calculate the initial value y only by performing simple product operation and sum operation. That allows a simple configuration of the arithmetic unit 30.

The arithmetic unit 30 may operate in response to the lock signal LK, instead of the mode signal MD. Specifically, the arithmetic unit 30 may perform an arithmetic operation when the lock detecting unit 20 detects that the multiplier circuit 10 returns to the lock state after it gets out of the lock state.

2. The Second Preferred Embodiment

Figure 12:
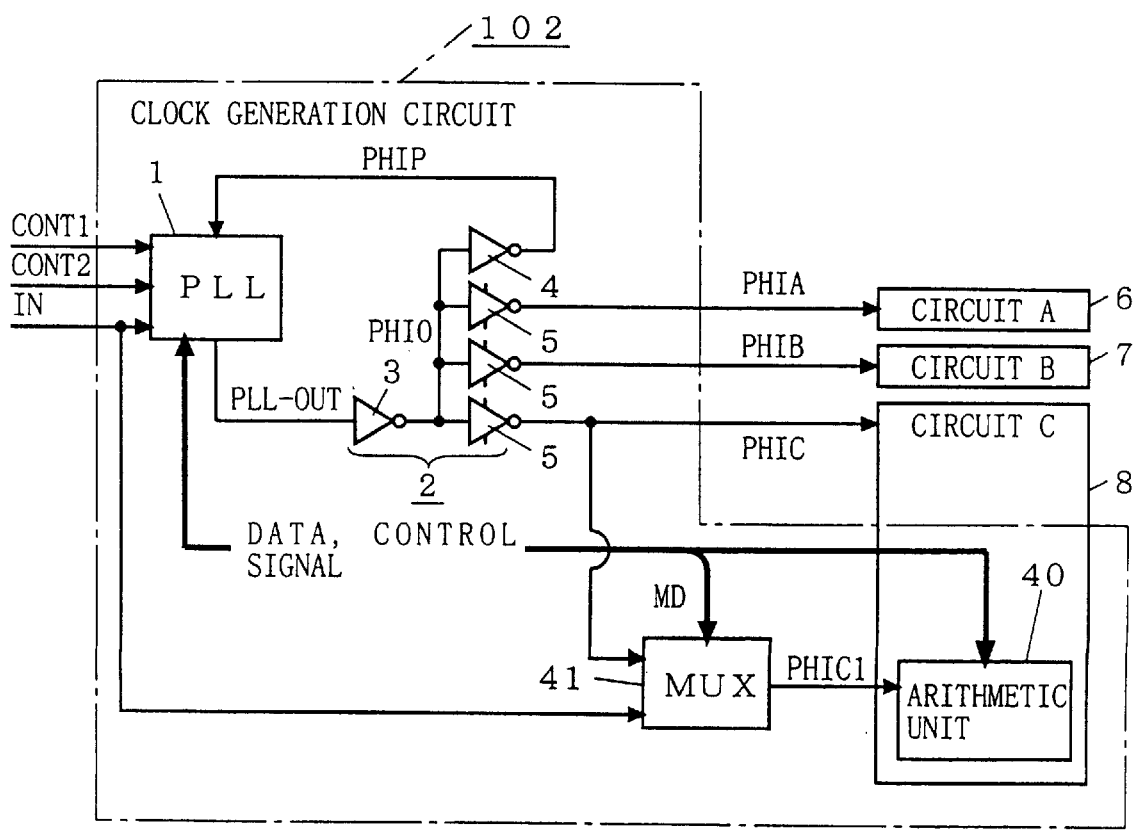
FIG. 12 is a block diagram of a clock generation circuit in accordance with a second preferred embodiment.

There may exist a semiconductor device in which circuits (e.g., circuits 6 to 8 in FIG. 1) supplied with a clock output from a clock generation circuit are incorporated together with the clock generation circuit in a semiconductor chip and one of the circuits 6 to 8 comprises an arithmetic unit capable of performing the function of the arithmetic unit 12 (see FIG. 2). FIG. 12 is a block diagram showing an example of such a semiconductor device.

The device of FIG. 12 comprises an arithmetic unit 40 in the circuit 8. The arithmetic unit 40 may be a microcomputer comprising a CPU and a semiconductor memory provided with a program defining the operation of the CPU, or may be an arithmetic unit for performing product/sum operation only with hardware. In the semiconductor device of FIG. 12, the clock generation circuit 102 shares the arithmetic unit 40 with the circuit 8.

The PLL circuit 1 is not provided with the arithmetic unit 12 and the arithmetic function which the arithmetic unit 12 should perform is achieved by the arithmetic unit 40. Further, a signal line is placed between the PLL circuit 1 and the arithmetic unit 40 so that various signals which should be supplied for and from the arithmetic unit 12 may be supplied for and from the arithmetic unit 40. The arithmetic unit 40 performs a normal operation for the circuit 8 and also performs an arithmetic operation which the arithmetic unit 12 should do in response to the mode signal MD supplied through the signal line as an interrupt.

The clock generation circuit 102 further comprises a multiplexer 41. The multiplexer 41 selects one of the input clock IN and the output clock PHIC in response to the mode signal MD supplied from the PLL circuit 1 and supplies the selected clock to the arithmetic unit 40 as an output clock PHIC1. Specifically, when the operation of the multiplier circuit 10 is in the input clock cycle measurement mode M1 or the counter operation/setting mode M2, the multiplexer 41 selects the input clock IN and otherwise selects the output clock PHIC. The arithmetic 40 operates in synchronization with the output clock PHIC1.

The arithmetic unit 40 can thereby switchably perform an original arithmetic operation for the circuit 8 and an arithmetic operation which the arithmetic unit 12 should do. In a period while the output clock PHIC is not stable immediately after the PLL circuit 1 starts operating, the arithmetic unit 40 can perform an arithmetic operation which the arithmetic unit 12 should do by receiving the input clock IN.

In a period while the output clocks PHIP, PHIA, PHIB and PHIC are not stable immediately after the PLL circuit 1 starts operating, the circuits 6 to 8 do not start performing their original operations. During this halt, the arithmetic operation which the arithmetic unit 12 should do can be performed by using the arithmetic unit 40. Therefore, it is possible to effectively use the arithmetic unit 40 without preventing the original operations for the circuits 6 to 8 at least immediately after the PLL circuit 1 starts operating.

Furthermore, when the multiplication ratio is changed or the clock cycle is changed, it takes one to several clock cycles for the arithmetic unit 40 to perform arithmetic operation for the PLL circuit 1 as an interrupt processing while stopping the original operation for the circuit 8, and therefore only a very small negative effect is posed on the original operation for the circuit 8.

Figure 13:
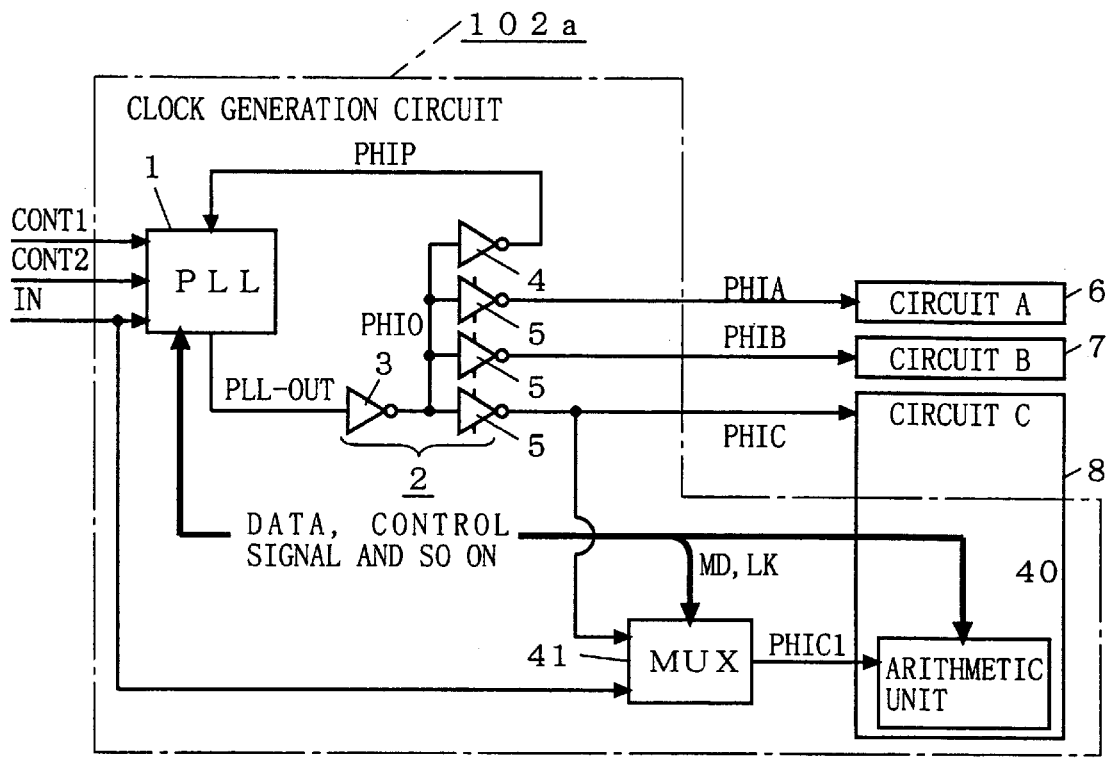
FIG. 13 is a block diagram of another clock generation circuit in accordance with the second preferred embodiment.

Further, as shown in FIG. 13, the clock generation circuit can be configured so that the arithmetic unit 40 may perform the function of the arithmetic unit 30 which is originally provided in the PLL circuit 1. In the clock generation circuit 102a, the arithmetic unit 40 performs a normal operation for the circuit 8 while performing an arithmetic operation which the arithmetic unit 30 should do in response to the mode signal MD and the lock signal LK supplied through the signal line as an interrupt processing. At the same time, the multiplexer 41 selects the output clock PHIC to perform a normal operation of the arithmetic unit 40 and selects the input clock IN to perform the interrupt processing in accordance with the mode signal MD and the lock signal LK.

The clock generation circuit 102a produces the same effect as the clock generation circuit 102. Specifically, the arithmetic unit 40 can perform an arithmetic operation which the arithmetic unit 30 should do by receiving the input clock IN even in a period while the output clock PHIC is not stable immediately after the PLL circuit 1 starts operating. Further, the arithmetic unit 40 can be effectively used with much smaller ill effect on the normal operation of the circuit 8.

3. The Third Preferred Embodiment

Another configuration to omit the arithmetic unit 12 will be discussed. By appropriately determining the amount of delay of the delay circuit 17, the half cycle t in Eq. 1 can be determined as below, using an integer m:

$$t = 2^m \cdot \Delta d$$

Then, Eq. 1 can be expressed as:

$$x = 2^m \cdot c/n - a \quad (7)$$

Figure 14:
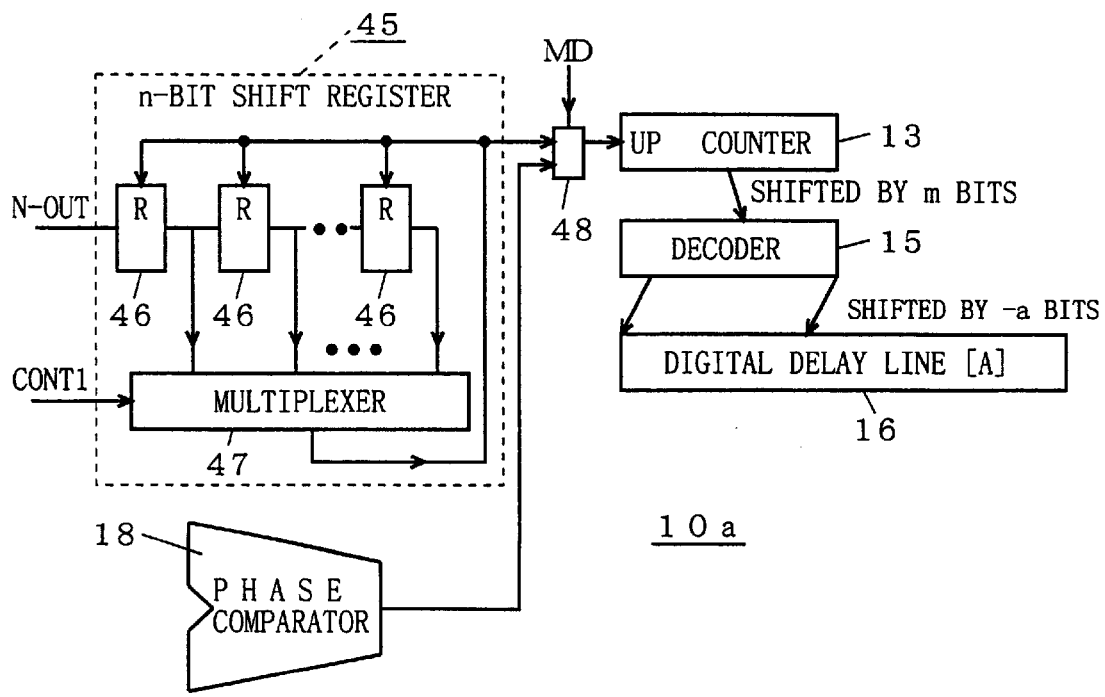
FIG. 14 is a block diagram showing part of a multiplier circuit in accordance with a third preferred embodiment.

In this case, by partially changing the multiplier circuit 10 of FIG. 2 into that of FIG. 14, the arithmetic unit 12 can be omitted. The changed multiplier circuit 10a is not configured on the premise that the amount of delay of the digital delay line 16 is set on the basis of an arithmetic operation for changes of the multiplication ratio or the clock cycle. In the multiplier circuit 10a, the amount of delay of the digital delay line 16 to achieve a lock state is determined without the arithmetic unit 12 after the reset signal PLL-RST is inputted.

In a case of FIG. 14, a shift register 45 having a simple configuration is used as an example of the pulse counter 9. The shift register 45 comprises a plurality of registers 46 and a multiplexer 47. A plurality of registers 46 are cascaded, sending and holding the multiplied clock N-OUT. The multiplexer 47 outputs a pulse when values held in a plurality of registers reach the multiplication ratio represented by the control signal CONT1. The pulse initializes the values held in a plurality of registers 46. Therefore, the shift register 45 outputs a pulse every time when the multiplied clock N-OUT reaches the multiplication ratio.

The signal output from the shift register 45 is inputted to the counter 13 through a selector 48. The selector 48 selects one of the output signal of the shift register 45 and that of the phase comparator 18 in accordance with the mode signal MD and transfers the selected one to the counter 13. Specifically, the selector 48 selects the output signal of the shift register 45 in a period from the time when the reset signal PLL-RST is input to the time when the operation of the multiplier circuit 10 first comes into the fine-tuning mode M3 and otherwise selects the output signal of the phase comparator 18.

When the reset signal PLL-RST is inputted, the count value of the counter 13 is first initialized to zero, like in the multiplier circuit 10. The multiplied clock N-OUT having the minimum cycle is thereby input to the shift register 45. The shift register 45 starts counting the multiplied clock N-OUT at a rise time of the input clock IN. Therefore, pulses, the number of which corresponds to the ratio of the number of pulses of the multiplied clock N-OUT to the multiplication ratio, i.e., the variable c/n in Eq. 7, are transferred from the shift register 45 to the counter 13 during one cycle of the input clock IN (i.e., during one clock cycle).

The counter 13 increments the count value by one every time when a pulse is inputted from the shift register 45. As a result, at a point of time when one clock cycle passes from the time when the shift register 45 starts counting, the count value of the counter 13 coincides with the variable c/n. At this time, the count value of the counter 13 is bit-shifted by +m bits and then transferred to the decoder 15. Therefore, a value corresponding to $2^m \cdot c/n$ is inputted to the decoder 15.

The output signal of the decoder 15 is bit-shifted by -a bits and then transferred to the digital delay line 16. Therefore, a value corresponding to the count value x given by Eq. 7 is input to the digital delay line 16. Specifically, the same value as the value determined in the multiplier circuit 10 through the arithmetic unit 12 is given to the digital delay line 16.

When the amount of delay of the digital delay line 16 is completely determined, the operation mode changes into the fine-tuning mode M3 and the output signal of the phase comparator 18 is inputted to the counter 13. An operation like that of the multiplier circuit 10 in the fine-tuning mode M3 is thereby achieved.

4. The Fourth Preferred Embodiment

Figure 15:
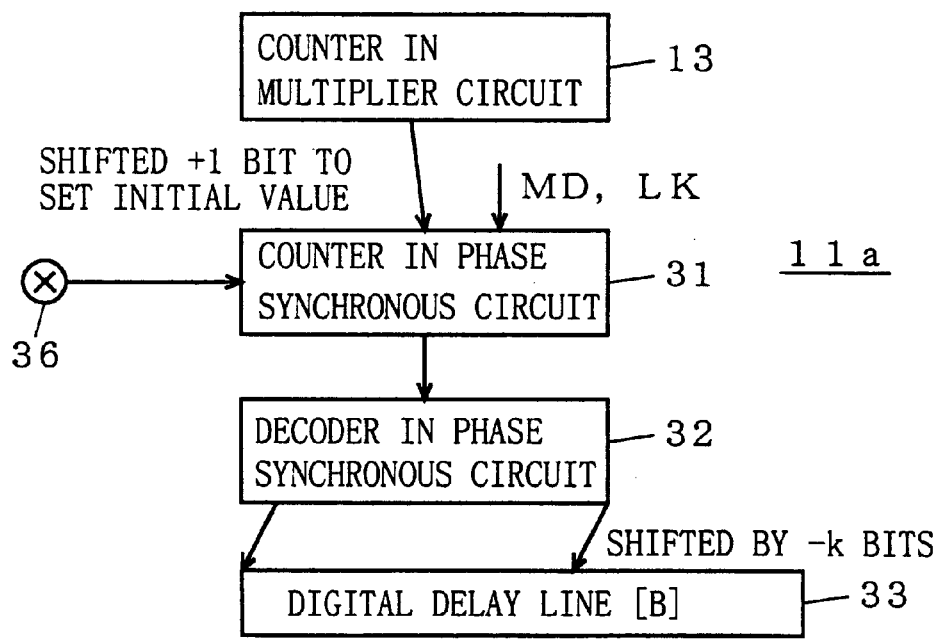
FIG. 15 is a block diagram showing part of a phase synchronous circuit in accordance with a fourth preferred embodiment.

Another configuration to omit the arithmetic unit 30 will be discussed. When the amount of delay of the fixed delay circuit 34 is determined so that Eq. 6 may be held, by partially changing the phase synchronous circuit 11 of FIG. 2 into that of FIG. 15, the arithmetic unit 30 can be omitted.

In the phase synchronous circuit 11a, the counter 31 is controlled by the mode signal MD and the lock signal LK, instead of the arithmetic unit 30 in the phase synchronous circuit 11. In the phase synchronous circuit 11a, like in the phase synchronous circuit 11, the count value of the counter 31 is usually incremented or decremented by the output signal of the phase comparator 35 input through the gate circuit 36.

After the reset signal PLL-RST is input, when the multiplication ratio is changed or when the clock frequency is changed, the count value of the counter 31 is updated with the count value of the counter 13. In more detail, after the count value of the counter 13 is set by the arithmetic unit 12 in the multiplier circuit 10 (of FIG. 2), when the multiplier circuit 10 comes into a lock state, the count value of the counter 31 is set by the counter 13. The count value x of the counter 13 is shifted by +1 bit and then inputted to the counter 31. As a result, a value of $2 \cdot x$ is set as the count value of the counter 31.

The count value of the counter 31 is decoded by the decoder 32. An output signal of the decoder 32 is bit-shifted by -k bits and then input to the digital delay line 33. As a result, a value corresponding to the count value y given by Eq. 6 is input to the digital delay line 33. Specifically, the same value as the value determined in the phase synchronous circuit 11 through the arithmetic unit 30 is given to the digital delay line 33. When the amount of delay of the digital delay line 33 is completely determined, a signal is input to the counter 31 from the gate circuit 36.

Further, the counter 31 may operate only in response to the lock signal LK, not under control of the mode signal MD. Specifically, the count value of the counter 13 may be set to the counter 31 when the lock detecting unit 20 detects that the multiplier circuit 10 returns to the lock state after it is out of a lock state.

5. The Fifth Preferred Embodiment

Figure 16:
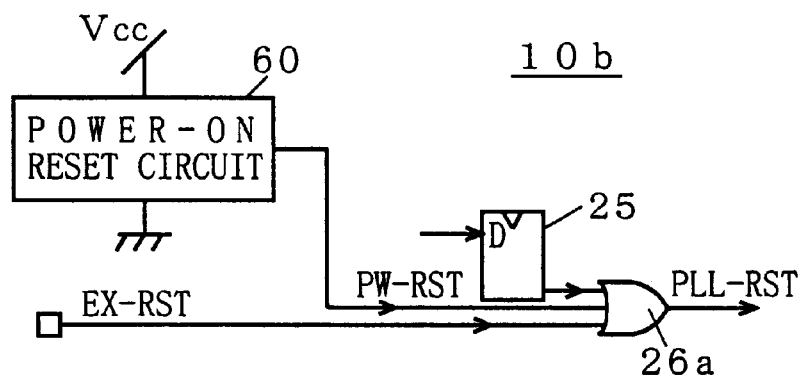
FIG. 16 is a block diagram showing part of a multiplier circuit in accordance with a fifth preferred embodiment.

Now, another configuration for generating the reset signal PLL-RST will be discussed. A multiplier circuit 10b of FIG. 16 comprises a power-on reset circuit 60, and its output signal, i.e., a power-on reset signal PW-RST is input to an OR circuit 26a together with the output signal of the latch 25 and the external reset EX-RST. The OR circuit 26a calculates a logical sum of three reset signals and outputs the calculated signal as the reset signal PLL-RST.

Figure 17:
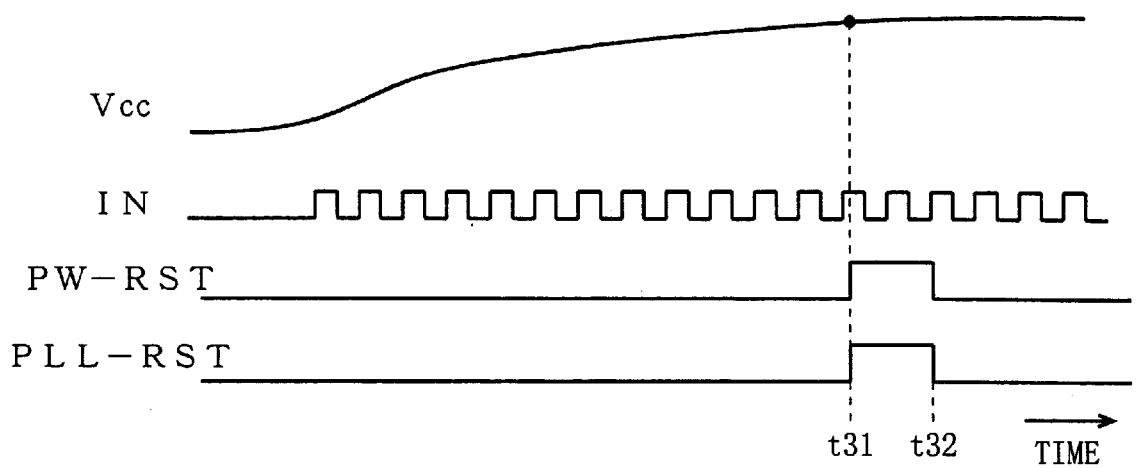
FIG. 17 is a timing chart of the multiplier circuit shown in FIG. 16.

FIG. 17 is a timing chart showing an operation of the multiplier circuit 10b. The power-on reset signal 60 monitors a power supply voltage Vcc and asserts the power-on reset signal PW-RST when the power supply voltage Vcc becomes lower than a predetermined value. Therefore, after the power turns on, when the power supply voltage Vcc becomes high enough to allow the power-on reset circuit 60 to operate, the power-on reset circuit 60 once asserts the power-on reset signal PW-RST (at time t31). The OR circuit 26a transfers the signal, without change, to the mode control unit 50 and the pulse counter 9 as the reset signal PLL-RST.

The mode control unit 50 and the pulse counter 9 are thereby initialized. At the point of time when the power supply voltage Vcc becomes high enough to allow a stable operation of all the elements in the PLL circuit 1 (at time t32), the power-on reset circuit 60 negates the power-on reset signal PW-RST. The operation in the input clock cycle measurement mode M1 thereby starts.

If the operation in the input clock cycle measurement mode M1 and the counter operation/setting mode M2 is performed in a period while the power supply voltage Vcc is unstable after power on and the amount of delay of the digital delay line 16 is therefore unstable, there may be a case where the value set as the count value of the counter 13 is not optimum one and it takes relatively long time to achieve a lock state. The multiplier circuit 10b, however, can avoid this problem because it comprises the power-on reset circuit 60.

Figure 18:
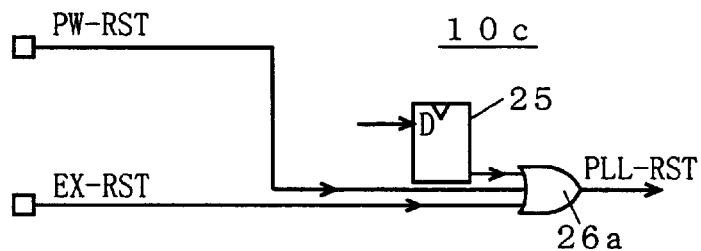
FIG. 18 is a block diagram showing part of another multiplier circuit in accordance with the fifth preferred embodiment.
Figure 19:
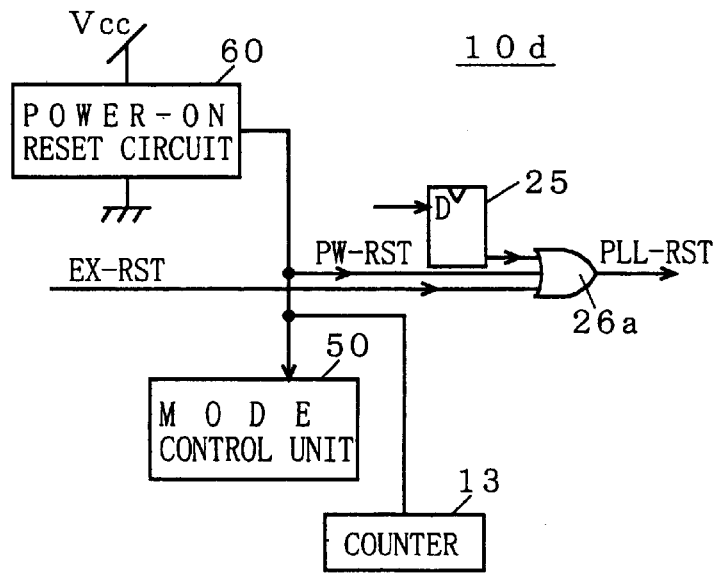
FIG. 19 is a block diagram showing part of still another multiplier circuit in accordance with the fifth preferred embodiment.
Figure 20:
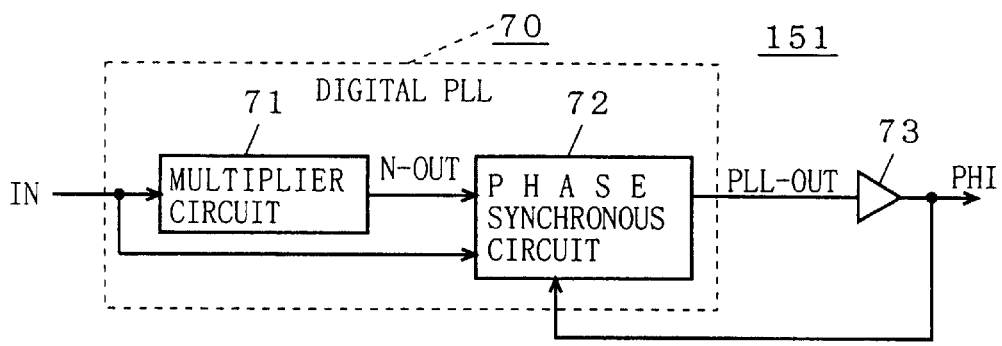
FIG. 20 is a block diagram of a clock generation circuit in the background art.

A terminal for relaying the power-on reset signal PW-RST input from the outside of the clock generation circuit may be provided, instead of the power-on reset circuit 60, as shown in a multiplier circuit 10c of FIG. 18. Further, a configuration of a multiplier circuit 10d as shown in FIG. 19 may be adopted, in which the power-on reset circuit 60 is provided and the power-on reset signal PW-RST is input to the mode control unit 50 additionally to the reset signal PLL-RST. The power-on reset signal PW-RST is also transferred to the counter 13.

Figure 22:
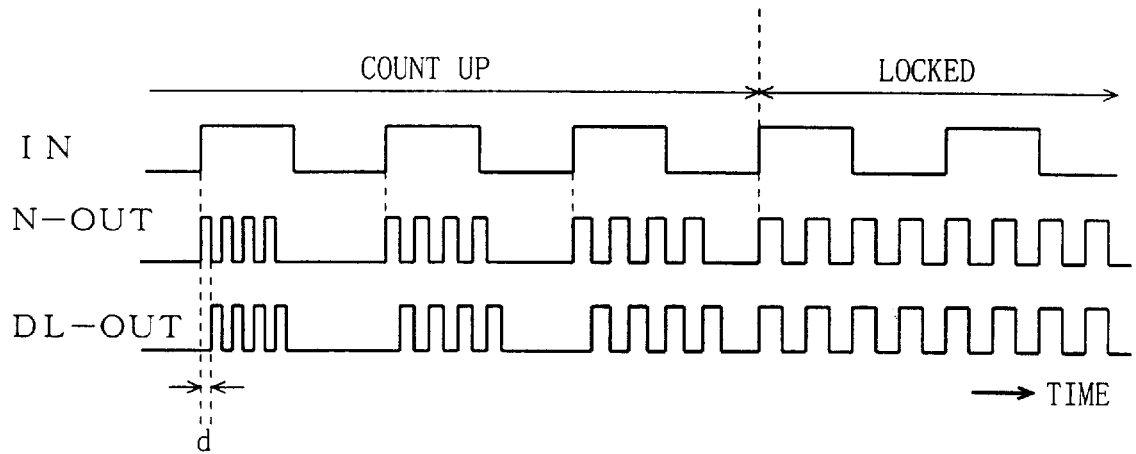
FIG. 22 is a timing chart of a multiplier circuit shown in FIG. 21.
Figure 23:
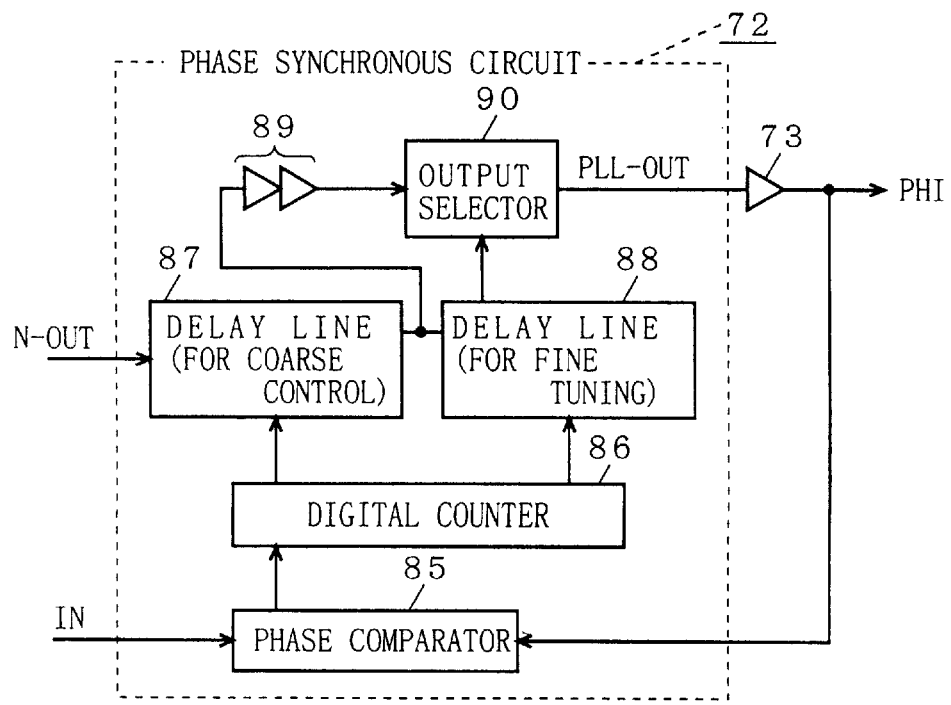
FIG. 23 is a block diagram of a phase synchronous circuit shown in FIG. 20.
Figure 24:
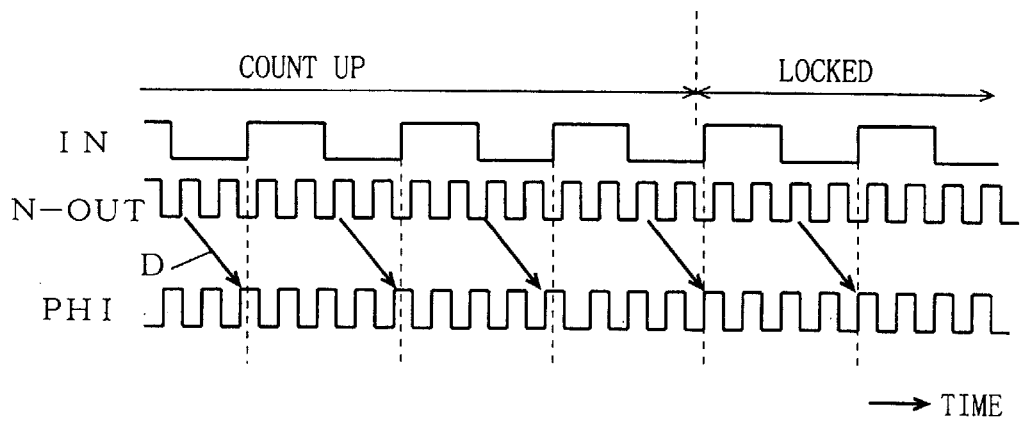
FIG. 24 is a timing chart of the phase synchronous circuit shown in FIG. 23.
Figure 25:
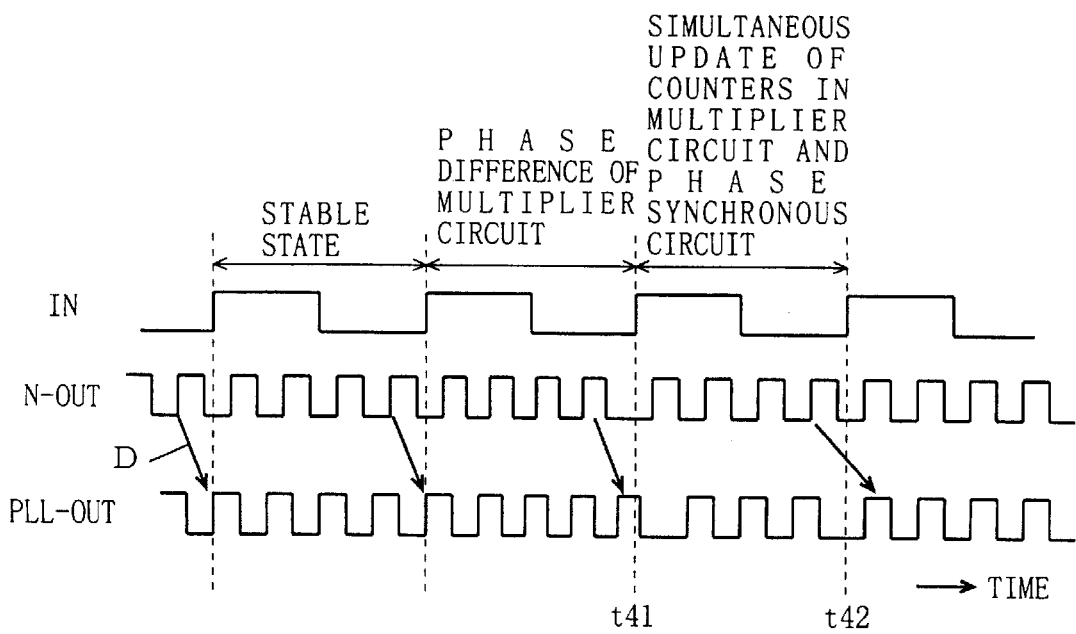
FIG. 25 is a timing chart of the clock generation circuit shown in FIG. 20.

In the multiplier circuit 10d, when the power-on reset signal PW-RST is asserted and then negated, the mode control unit 50 changes the operation mode into the fine-tuning mode M3, not into the input clock cycle measurement mode M1, as an exceptional case of the operation mode change shown in FIG. 3. At the same time, the count value of the counter 13 is initialized to the minimum value with the power-on reset signal PW-RST. Therefore, until the lock state is thereafter achieved, like the initial operation (see FIG. 22) of the background-art multiplier circuit 71 (see FIG. 21), the count value of the counter 13 is incremented every clock cycle.

When the multiplication ratio is changed or the clock cycle is changed, like in the multiplier circuit 10 (see FIG. 2), the arithmetic unit 12 calculates the count value of the counter 13. Further, when the power-on reset signal PW-RST is not asserted and the external reset EX-RST is asserted or the latch 25 asserts its output signal, as shown in FIG. 3, the operation mode is changed into the input clock cycle measurement mode M1. Thus, by disabling the arithmetic unit 12 from determining the count value of the counter 13 only when the power-on reset signal PW-RST is asserted, it does not take longer time than in the background-art multiplier circuit 71 to achieve the lock state immediately after power on.

While the invention has been shown and described in detail, the foregoing description is in all aspects illustrative and not restrictive. It is therefore understood that numerous modifications and variations can be devised without departing from the scope of the invention.

What is claimed is:

1. A clock generation circuit for multiplying a frequency of an input clock by a multiplication ratio to output the same, comprising:

a ring oscillator, including a variable delay circuit which changes the amount of delay step by step within a loop, for outputting an oscillating clock from a part of said loop as an output clock;

a phase comparator for comparing two phases of a) said input clock and b) said oscillating clock generated from a part of said loop;

a counter for changing a count value defining said amount of delay in such a direction as to cancel a difference between said two phases based on a comparison result of said phase comparator; and an arithmetic unit for calculating the count value, corresponding to the amount of delay with which said two phases coincide with each other in response to at least one control signal, to output the count value to said counter.

2. The clock generation circuit according to claim 1, further comprising:

a pulse counter for counting the number of pulses of said output clock, wherein said arithmetic unit measures a cycle of said input clock by said number of pulses in response to a reset signal which belongs to said at least one control signal and calculates the count value corresponding to the amount of delay with which said two phases coincide with each other with respect to said cycle which is measured and said multiplication ratio, to output the count value to said counter.

3. The clock generation circuit according to claim 1, wherein said arithmetic unit does not perform calculation or outputting until said two phases first coincide with each other after power-on of said clock generation circuit.

4. The clock generation circuit according to claim 1, wherein said arithmetic unit, in response to a signal which belongs to said at least one control signal and indicates a change of said multiplication ratio, calculates the count value corresponding to the amount of delay with which said two phases coincide with each other with respect to a present cycle of said input clock and a multiplication ratio after being changed as indicated by said signal, to output the count value to said counter.

5. The clock generation circuit according to claim 1, wherein said arithmetic unit, in response to a signal which belongs to said at least one control signal and indicates a change of a cycle of said input clock together with a ratio of said cycle after change to that before change, calculates the count value corresponding to the amount of delay with which said two phases coincide with each other with respect to a cycle of said input clock after being changed as indicated by said signal and a present multiplication ratio, to output the count value to said counter.

6. The clock generation circuit according to claim 1, further comprising:

a multiplexer for selectively outputting said input clock and said output clock, wherein said arithmetic unit operates in synchronization with a clock output from said multiplexer and performs an arithmetic operation besides calculation and outputting of said count value, and said multiplexer selects said input clock when said arithmetic unit performs calculation and outputting of said count value and selects said output clock when said arithmetic unit performs said arithmetic operation.

7. The clock generation circuit according to claim 2, wherein said counter initializes said count value in response to said reset signal so that the amount of delay of said variable delay circuit becomes minimum.

8. The clock generation circuit according to claim 2, further comprising:

a power-on reset circuit for outputting said reset signal when a power supply voltage to be supplied for said clock generation circuit is lower than a predetermined value.

9. The clock generation circuit according to claim 2, further comprising:

a reset circuit for outputting said reset signal when a certain number of pulses, the number of which corresponds to said multiplication ratio, are not output as an output clock during one cycle of said input clock.

10. A clock generation circuit for multiplying a frequency of an input clock by a multiplication ratio to output the same, comprising:

- a ring oscillator, including a first variable delay circuit which changes the amount of delay step by step within a loop, for outputting an oscillating clock from a part of said loop as a multiplied clock;
- a first phase comparator for comparing two phases of a) said input clock and b) said oscillating clock generated from a part of said loop;
- a first counter for changing a first count value defining said amount of delay in such a direction as to cancel a difference between said two phases based on a comparison result of said first phase comparator;
- a second variable delay circuit for delaying said multiplied clock to be output as an output clock, to allow step-by-step change of the amount of delay;
- a second phase comparator for comparing two phases of said input clock and said output clock; and
- a second counter for changing a second count value defining said amount of delay of said second variable delay circuit in such a direction as to cancel a difference between said two phases compared by said second phase comparator only when said two phases compared by said first phase comparator coincide with each other.

11. A clock generation circuit for multiplying a frequency of an input clock by a multiplication ratio to output the same, comprising:

- a ring oscillator, including a first variable delay circuit which changes the amount of delay step by step within a loop, for outputting an oscillating clock from a part of said loop as a multiplied clock;
- a first phase comparator for comparing two phases of a) said input clock and b) said oscillating clock generated from a part of said loop;
- a first counter for changing a first count value defining said amount of delay in such a direction as to cancel a difference between said two phases based on a comparison result of said first phase comparator;
- a second variable delay circuit for delaying said multiplied clock to be output as an output clock, to allow step-by-step change of the amount of delay;
- a second phase comparator for comparing two phases of said input clock and said output clock;
- a second counter for changing a second count value defining said amount of delay of said second variable delay circuit in such a direction as to cancel a difference between said two phases compared by said second phase comparator; and
- an arithmetic unit for calculating the second count value corresponding to the amount of delay with which said two phases compared by said second phase comparator coincide with each other in response to at least one control signal, to output the second count value to said second counter.

12. The clock generation circuit according to claim 11, further comprising:

- a multiplexer for selectively outputting said input clock and said output clock,
- wherein said arithmetic unit operates in synchronization with a clock output from said multiplexer and performs an arithmetic operation besides calculation and outputting of said second count value, and
- said multiplexer selects said input clock when said arithmetic unit performs calculation and outputting of said second count value and selects said output clock when said arithmetic unit performs said arithmetic operation.

13. The clock generation circuit according to claim 11, wherein said control signal is input at the time of transition from a state where said two phases compared by said first phase comparator are different from each other to a state where the two phases coincide with each other.

14. The clock generation circuit according to claim 11, wherein said control signal is referred to as a first control signal, said clock generation circuit further comprising:
- another arithmetic unit for calculating the first count value corresponding to the amount of delay with which said two phases compared by said first phase comparator coincide with each other in response to a second control signal, to output the first count value to said counter,
- wherein said first signal is input after said another arithmetic unit sets said first count value.

15. The clock generation circuit according to claim 11, wherein said second counter changes the second count value defining said amount of delay of said second variable delay circuit in such a direction as to cancel a difference between said two phases compared by said second phase comparator only when said two phases compared by said first phase comparator coincide with each other.

* * * * *